(12) United States Patent
Rehmeyer et al.

(10) Patent No.: US 10,748,600 B2
(45) Date of Patent: Aug. 18, 2020

(54) PHASE CHARGE SHARING REDUCTION

(71) Applicant: Micron Technology, Inc., Boise, ID (US)

(72) Inventors: James S. Rehmeyer, Boise, ID (US);
George B. Raad, Boise, ID (US);
Debra M. Bell, Boise, ID (US);
Markus H. Geiger, Boise, ID (US);
Anthony D. Veches, Boise, ID (US)

(73) Assignee: Micron Technologies, Inc., Boise, ID (US)

( * ) Notice: Subject to any disclaimer, the term of this patent is extended or adjusted under 35 U.S.C. 154(b) by 0 days.

(21) Appl. No.: 16/216,894

(22) Filed: Dec. 11, 2018

(65) Prior Publication Data

US 2020/0185024 A1    Jun. 11, 2020

(51) Int. Cl.
*G11C 11/4094* (2006.01)
*G11C 11/408* (2006.01)
*G11C 11/4096* (2006.01)
*G11C 11/406* (2006.01)

(52) U.S. Cl.
CPC ........ *G11C 11/4094* (2013.01); *G11C 11/406* (2013.01); *G11C 11/4085* (2013.01); *G11C 11/4096* (2013.01)

(58) Field of Classification Search
None
See application file for complete search history.

(56) References Cited

U.S. PATENT DOCUMENTS 6,236,258 B1 * 5/2001 Hoenigschmid ...... H01L 27/105
257/E27.081

* cited by examiner

*Primary Examiner* — James G Norman
(74) *Attorney, Agent, or Firm* — Holland & Hart LLP

(57) ABSTRACT

Methods, systems, and devices for phase charge sharing are described. In some memory systems or memory devices, one or more decoders may be used to bias access lines of a memory die. The decoders may transfer voltage or current between a first conductive line of the decoder and a second conductive line of the decoder via a shorting device. Transferring the voltage or current may be performed as part of or in association with an operation (e.g., an activate or precharge operation) to access one or more memory cells of the memory die. In some examples, the decoders may transfer voltage or current between a first conductive line of a decoder associated with a first refresh activity and a second conductive line of the decoder associated with a second refresh activity via a shorting device.

25 Claims, 13 Drawing Sheets

PHASE CHARGE SHARING REDUCTION

BACKGROUND

The following relates generally to a system that includes at least one memory device and more specifically to phase charge sharing.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source.

In some cases, access to a memory cell may be controlled through one or more decoders (e.g., a row decoder, a column decoder). The one or more decoders may be configured to apply signals to access lines associated with the memory cells.

BRIEF DESCRIPTION OF THE DRAWINGS

Examples of the disclosure are described with reference to the following figures.

DETAILED DESCRIPTION

Memory devices may use decoders to bias access lines of a memory die to access memory cells of that memory die. Conductive lines in the decoders may be biased to different voltage levels as part of different operations performed on the memory die. It may be advantageous to share charge or voltage between these conductive lines of the decoder to consume less power or to reduce the time needed for operations or between operations.

In some memory devices, voltage may be transferred between a first conductive line of a decoder and a second conductive line of the decoder. In some cases, voltage may be transferred between a conductive line (referred to as a phase (FX) line) associated with a FX driver and a conductive line (referred to as a phase bar (FXF) line) associated with an FXF driver. For example, the voltage may be transferred between the FX line and the FxF line as part of a cell access operation (e.g., IDD0). In some cases, voltage may be transferred between a FX line associated with a first FX driver and an FX line associated with a second FX driver. For example, the voltage may be transferred between the FX line of the first FX driver and the FX line of the second FX driver as part of a memory refresh operation (e.g., IDD5B). Additionally or alternatively, voltage may be transferred between an FxF line associated with a first FXF driver and an FxF line associated with a second FXF driver. In general, voltage being transferred between the first conductive line and the second conductive line may be associated with exchanging charge between the two conductive lines.

In some cases, a shorting device (e.g., a transistor), may short the FX line and the FxF line. Shorting the two conductive lines, when each conductive line is at a different voltage, may enable voltage transfer (or charge exchange) between the two conductive lines. In some cases, shorting the two conductive lines may enable a decrease in a supply current or a peak pulse current used to generate the voltages on each conductive line.

Features of the disclosure introduced above are further described below at an exemplary system level in the context of FIG. 1 Specific examples of driver configurations and timing diagrams are then described in the context of FIGS. 2 through 7. These and other features of the disclosure are further illustrated by and described with reference to an apparatus diagram of FIG. 8 that describes various components related to a controller as well as flowcharts of FIGS. 9 through 12 that relate to a method or methods for phase charge sharing as described herein.

Figure 1:
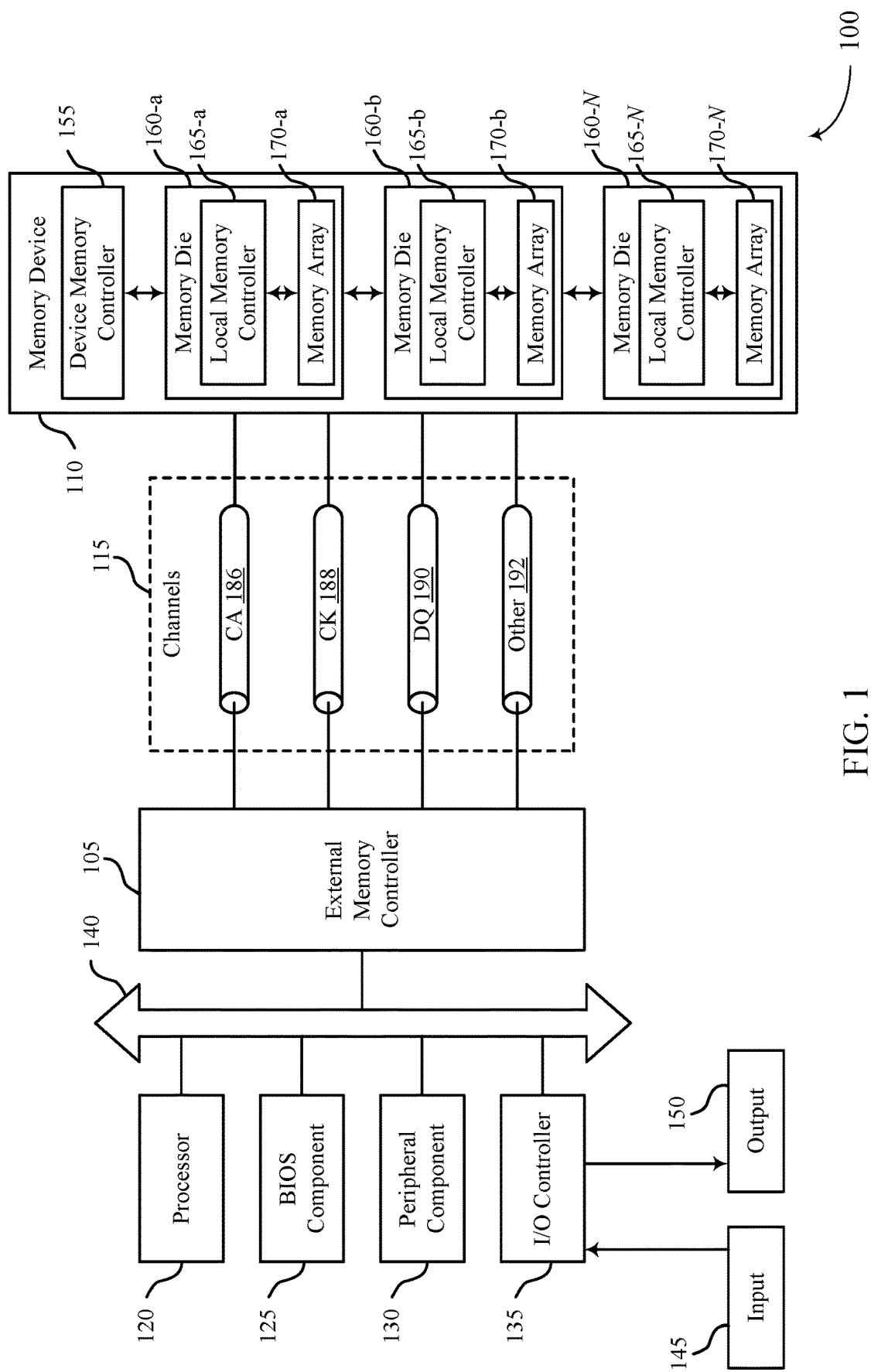
FIG. 1 illustrates an example of a system for operating a memory device that supports phase charge sharing as disclosed herein.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a graphics processing unit (GPU), a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include one or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a GPU, a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The one or more memory dice 160 may each contain decoders (e.g., row decoders and column decoders). A decoder may receive an address and, subsequently, activate one or more access lines, which may enable access to one or more memory cells. A decoder may include one or more FX drivers and one or more FXF drivers, which may assist in performing operations on one or more memory cells. During, before, and/or after an operation and/or between operations on one or more memory cells (e.g., during a memory cell access or memory refresh operation), one or more conductive lines of a FX driver may be shorted with one or more conductive lines of a FXF driver, one or more conductive lines of a FX driver may be shorted with one or more conductive lines of another FX driver, and/or one or more conductive lines of a FXF driver may be shorted with one or more conductive lines of another FXF driver. Such shorting may, for instance, minimize power consumption associated with performing the operation(s) on one or more memory cells.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), and so forth.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
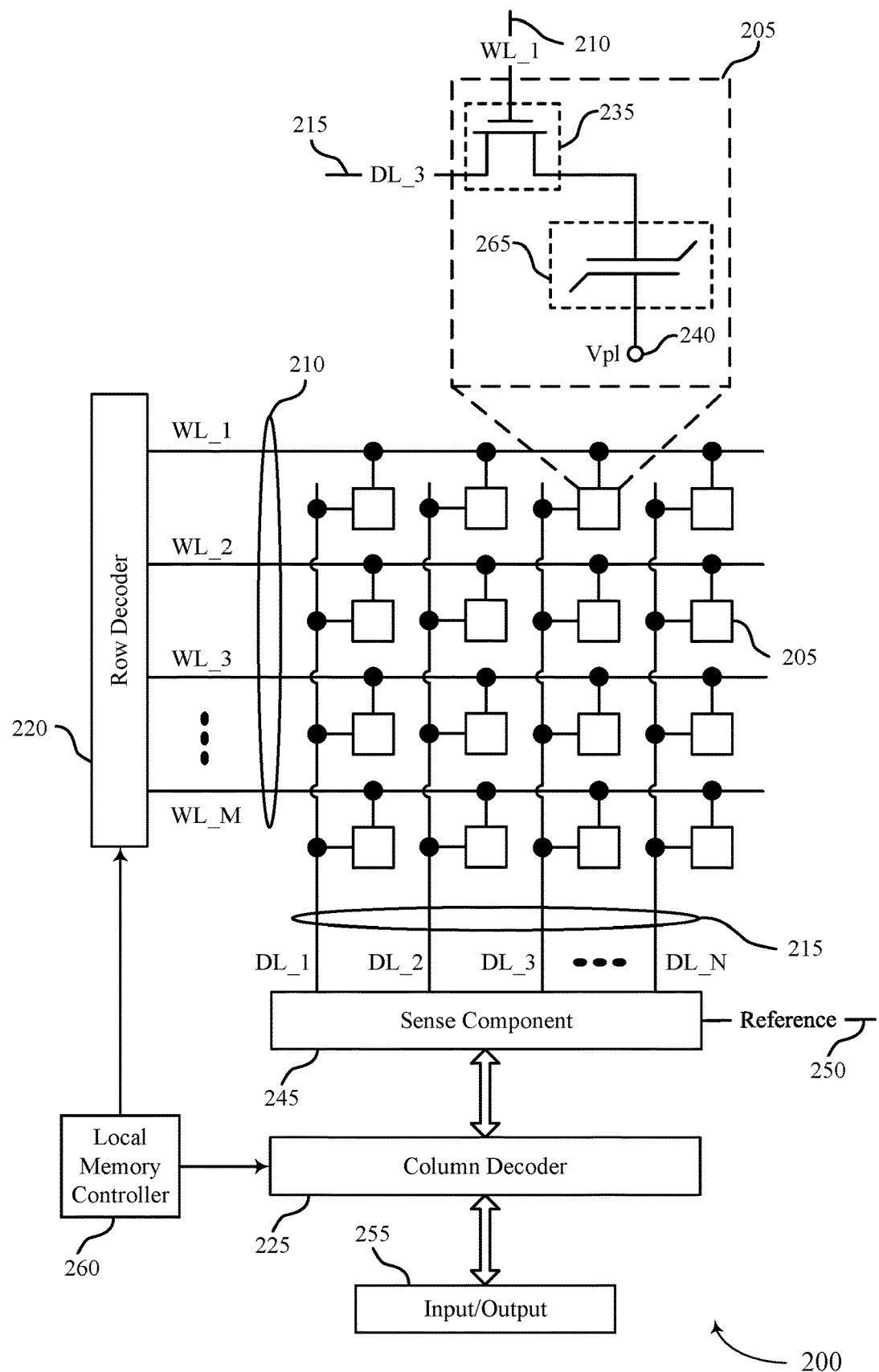
FIG. 2 illustrates an example memory die that supports phase charge sharing as disclosed herein.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 (e.g., opening the word line 210) based on the received row address. A column decoder 225 may receive a column address from the local memory controller 260 and may activate a digit line 215 (e.g., opening the digit line 215) based on the received column address. For example, the memory die 200 may include multiple word lines 210, labeled WL_1 through WL M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205. In some cases, row decoder 220 and/or column decoder 225 may deactivate the word line 210 (e.g., close the word line 210) and/or deactivate the digit line 215 (e.g., close the digit line 215).

In some cases, a row decoder 220 and/or a column decoder 225 may include one or more FX drivers and/or one or more FXF drivers. During, before, and/or after a memory cell operation and/or between memory cell operations (e.g., a memory access or memory refresh operation), one or more conductive lines (e.g., a FX line) of a FX driver may be shorted with one or more conductive lines (e.g., a F×F line) of a FXF driver; one or more conductive lines of a FX driver may be shorted with one or more conductive lines of another FX driver; and/or one or more conductive lines of a FXF driver may be shorted with one or more conductive lines of another FXF driver. Such shorting may be facilitated by one or more shorting devices (e.g., one or more transistors) included within row decoder 220 and/or column decoder 225 and may minimize power associated with performing the memory cell operation(s).

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
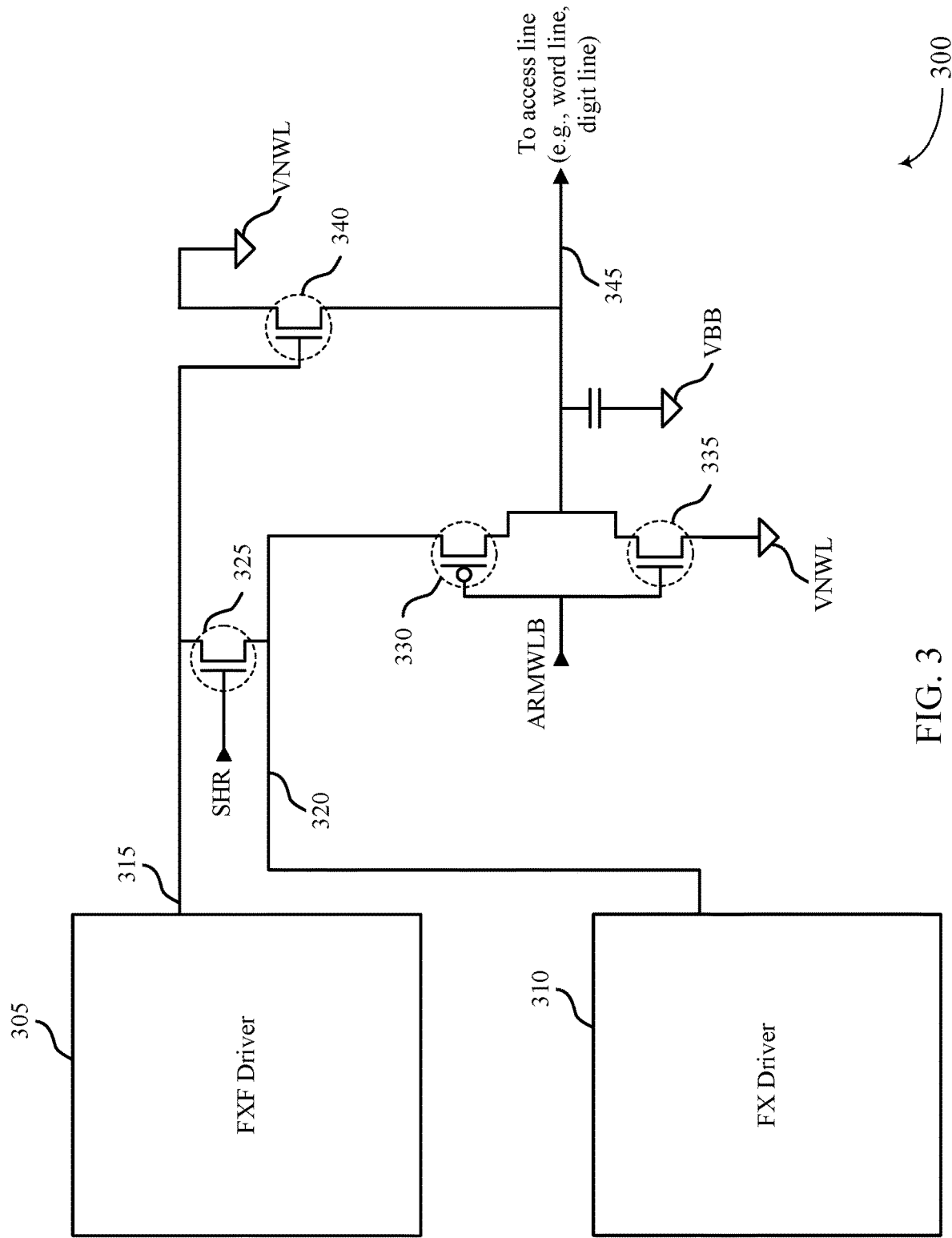
FIG. 3 illustrates an example of a decoder circuit that supports phase charge sharing as disclosed herein.

FIG. 3 illustrates an example of a decoder circuit 300 that supports phase charge sharing as disclosed herein with reference to FIGS. 1 and 2. In some examples, decoder circuit 300 may implement aspects of system 100 or memory die 200. For instance, the decoder circuit 300 may represent aspects of a decoder (e.g., a row decoder 220 or a column decoder 225 as described with reference to FIG. 1). The decoder circuit 300 may include an FXF driver 305, a FX driver 310, an F×F line 315 (e.g., a conductive line), a FX line 320 (e.g., a conductive line), an equalizing transistor 325, a first access driver line transistor 330, a second access driver line transistor 335, a third access driver line transistor 340, and an access driver line 345.

The FXF driver 305 may be configured to output one or more voltages (e.g., VCCP, which may be a pumped common collector voltage, or VSS, which may be a single supply voltage) to FxF line 315. The FX driver 310, meanwhile, may be configured to output one or more voltages (e.g., VCCP or VSS) to the FX line 320. In some cases, one or both of the FXF driver 305 and the FX driver 310 may hold their respective lines (e.g., the FxF line 315 and the FX line 320) in a floating state. In some cases, the equalizing transistor 325 may be configured to couple the FxF line 315 with the FX line 320, which may enable an exchange of charge and/or voltage transfer between FxF line 315 and FX line 320 (e.g., if FxF line 315 and FX line 320 have a difference in potential). In some cases, the FxF line 315 and the FX line 320 may be coupled when the FxF line 315 and/or the FX line 320 are held in a floating state.

The first access driver line transistor 330 and/or the second access driver line transistor 335 may be configured to couple the access driver line 345 with the FX line 320 or a voltage source. In some cases, the voltage source may be associated with the second access driver line transistor 335 (e.g., a voltage source supplying a negative word line voltage (VNWL)). For instance, if a main access line signal (e.g., ARMWLB) activates the first access driver line transistor 330 (e.g., if ARMWLB is low), the FX line 320 may supply a voltage (e.g., VCCP) to the access driver line 345. In cases where the main access line signal activates the second access driver line transistor 335 (e.g., if ARMWLB is high), the voltage source associated with the second access driver line transistor 335 may supply a voltage (e.g., VNWL) to the access driver line 345.

The third access driver line transistor 340 may be configured to couple a voltage source associated with the third access driver line transistor 340 to the access driver line 345 based on voltages applied to the FxF line 315. For instance, a voltage of the FxF line may be applied to the gate of the third access driver line transistor 340 (e.g., a VCCP supplied to the FxF line 315 by the FXF driver 305). The third access driver line transistor 340 may be activated based on applying the voltage to its gate. In such cases, the third access driver line transistor 340 may couple a voltage source associated with the third access driver line transistor 340 (e.g., a voltage source supplying VNWL) with the access driver line 345. In some cases, the voltage source VNWL may be a ground or a virtual ground. Alternatively, a voltage applied to the gate of the third access driver line transistor 340 (e.g., a VSS supplied to the FxF line 315 by the FXF driver 305) may deactivate the third access driver line transistor 340. In such cases, the third access driver line transistor 340 may decouple the voltage source associated with the third access driver line transistor 340 from the access driver line 345.

In some cases, the access driver line 345 may be in electronic communication with an access driver (e.g., a sub word line driver) that is, further, coupled with an access line (e.g., a word line or a digit line). In other cases, the access driver line 345 may be coupled with the access line itself.

In some cases, decoder circuit 300 may perform an activate operation. In an activate operation, the FxF line 315 may, for instance, initially be at a high voltage value (e.g., VCCP) and the FX line 320 may initially be at a low voltage value (e.g., VSS) that is a complement of the high voltage value. Further, the equalizing transistor 325 may initially be in a deactivated state (e.g., the FxF line 315 may not be coupled with the FX line 320) and the third access driver line transistor 340 may be in an activated state (e.g., the high voltage on the FxF line 315 may activate the third access driver line transistor 340). Upon starting the activate operation, FXF driver 305 and the FX driver 310 may hold the FxF line 315 and the FX line 320, respectively, in floating states. After the FxF line 315 and the FX line 320 are held in floating states, the equalizing transistor 325 may be activated (e.g., via a SHR signal), which may couple FxF line 315 with FX line 320. After FxF line 315 and FX line 320 are coupled, FxF line 315 and FX line 320 may transfer voltage and/or exchange charge for a period of time. As a result of transferring voltage and/or exchanging charge, the voltage of the FX line 320 may increase and the voltage of the FxF line 315 may decrease, or vice versa as the case may be.

After voltage or charge is transferred between the FxF line 315 and the FX line 320, the equalizing transistor 325 may be deactivated (e.g., via the SHR signal). The FXF driver 305 and the FX driver 310 may cease holding the FxF line 315 and the FX line 320 in the floating state and the FXF driver 305 may output a low voltage (e.g., VSS) and the FX driver 310 may output a high voltage (e.g., VCCP). FxF line 315 and FX line 320 may settle at the high voltage and low voltage, respectively. Upon decreasing the voltage on FxF line 315, the third access driver line transistor 340 may deactivate, which may decouple the voltage source associated with the third access driver line transistor 340 from the access driver line 345. If the first driver access line transistor is 330 is activated (e.g., if ARMWLB is at a low voltage value), the high voltage (e.g., VCCP) may be applied to the access driver line 345.

In some cases, decoder circuit 300 may perform a pre-charge operation. In a pre-charge operation, the FxF line 315 may initially be at a low voltage (e.g., VSS) and the FX line 320 may initially be at a high voltage (e.g., VCCP) that is a complement of the low voltage. Further, the equalizing transistor 325 may be in a deactivated state (e.g., the FxF line 315 may not be coupled with the FX line 320) and the third access driver line transistor 340 may be in a deactivated state (e.g., due to the FxF line 315 being at a low voltage). Upon starting the pre-charge operation, the FXF driver 305 and the FX driver 310 may hold the FxF line 315 and the FX line 320, respectively, in floating states. After the FxF line 315 and the FX line 320 are held in floating states, the equalizing transistor 325 may be activated (e.g., via a SHR signal), which may couple the FxF line 315 with the FX line 320. After the FxF line 315 and the FX line 320 are coupled, the FxF line 315 and the FX line 320 may exchange charge for a period of time. As a result of exchanging charge, the voltage of the FX line 320 may decrease and the voltage of the FxF line 315 may increase, or vice versa as the case may be.

After voltage or charge is transferred between the FxF line 315 and the FX line 320, the equalizing transistor 325 may be deactivated (e.g., via the SHR signal). The FXF driver 305 and the FX driver 310 may cease holding the FxF line 315 and the FX line 320 in the floating state and output the high voltage value and the low voltage value, respectively. After the FXF driver 305 applies the high voltage to the FxF line 315 and the FX driver 310 applies the low voltage to the FX line 320, the FxF line 315 may increase to the high voltage and the FX line 320 may decrease to the low voltage. Upon increasing the FxF line 315 to the high voltage, the third access driver line transistor 340 may activate, which may couple the voltage source associated with the third access driver line transistor 340 to the access driver line 345. In some cases, the FX driver 310 may hold the FX line 320 in a floating state after exchanging the charge and/or transferring voltage with the FxF line 315 (e.g., the FX line 320 may be held in a floating state while the voltage source associated with the third access driver line transistor 340 is coupled with the access driver line 345). In other cases, the low voltage value output by the FX driver 310 may be approximately equal to a voltage supplied by the voltage source associated with the third access driver line transistor 340. In some cases, an activate operation may occur after a pre-charge operation or vice-versa.

Coupling the FX line 320 with the F×F line 315 may reduce an amount of power consumption associated with performing one or more memory cell operations (e.g., a memory cell access operation or a memory refresh operation). Separate operations (e.g., an activate operation and a pre-charge operation) may be associated with different voltages on a same conductive line (e.g., an F×F line 315 or a FX line 320). For instance, a voltage on a FX line 320 or an F×F line 315 during a first operation (e.g., an activate operation) may be different than a voltage on the FX line 320 or the F×F line 315, respectively, during a second operation (e.g., a pre-charge operation). Further, the voltage on a FX line 320 or an F×F line 315 during a portion of a first operation may be approximately the same as a voltage on the F×F line 315 or FX line 320, respectively, during a portion of a second operation. Sharing charge (e.g., via equalizing transistor 325 between the FX line 320 and the F×F line 315 may decrease the potential difference between the FX line 320 and the F×F line 315, which may reduce an amount of charge or a duration of a current supplied from FX driver 310 and/or FXF driver 305 to reach voltages associated with a memory cell operation. Reducing the amount of supplied charge may reduce power consumption. Such coupling may, further, reduce latency or errors associated with performing memory cell operations.

Figure 4:
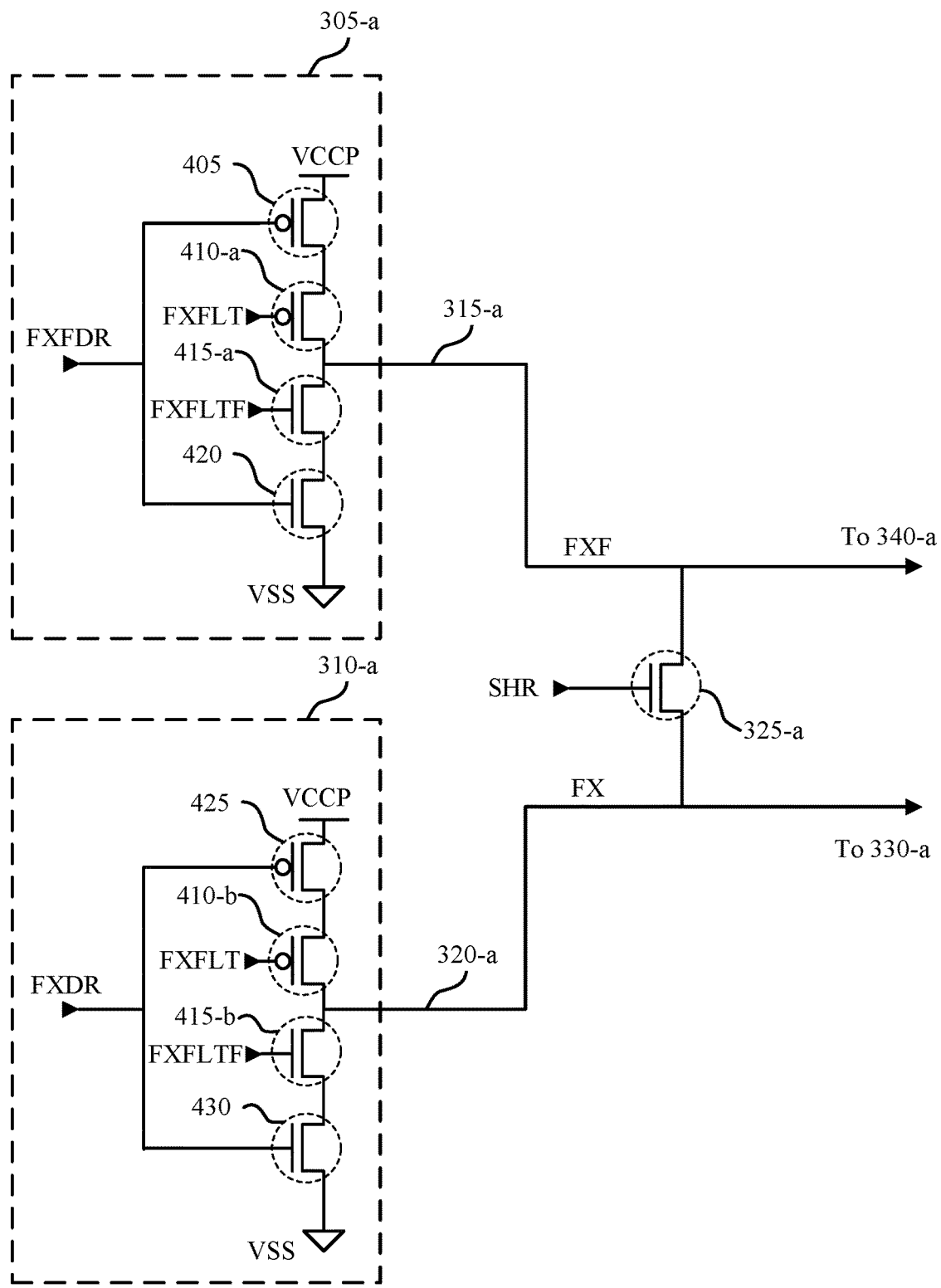
FIG. 4 illustrates an example of a driver configuration that supports phase charge sharing as disclosed herein.

FIG. 4 illustrates an example of a driver configuration 400 that supports phase charge sharing (e.g., for memory cell access operations, which may include IDD0, and/or memory refresh operations, which may include IDD5B) as disclosed herein. In some examples, driver configuration 400 may include one or more components described herein with reference to FIGS. 1-3. For example, the driver configuration 400 may include a FXF driver 305-a, which may be an example of a FXF driver 305 as described with reference to FIG. 3; a FX driver 310-a, which may be an example of a FX driver 310 as described with reference to FIG. 3; a F×F line 315-a, which may be an example of an F×F line 315 as described with reference to FIG. 3; a FX line 320-a, which may be an example of a FX line 320 as described with reference to FIG. 3; and a equalizing transistor 325-a, which may be an example of a equalizing transistor 325 as described with reference to FIG. 3.

FXF driver 305-a may include a FXFDR low transistor 405, a low float transistor 410-a, a high float transistor 415-a, and a FXFDR high transistor 420. The FXFDR low transistor 405 may selectively couple (e.g., via a FXFDR signal) a first voltage source (e.g., a VCCP source) with a terminal of the low float transistor 410-a. Low float transistor 410-a may selectively couple (e.g., via a FXFLT signal) a terminal of the FXFDR low transistor 405 with F×F line 315-a and a terminal of high float transistor 415-a. High float transistor 415-a may selectively couple (e.g., via a FXFLTF signal) a terminal of FXFDR high transistor 420 with F×F line 315-a and a terminal of low float transistor 410-a. The FXFDR high transistor 420 may selectively couple (e.g., via a FXFDR signal) a second voltage source (e.g., a VSS source) with a terminal of high float transistor 415-a. In cases where both the FXFDR low transistor 405 and low float transistor 410-a are activated, FXF driver 305-a may output a voltage associated with the first voltage source. In cases where both high float transistor 415-a and the FXFDR high transistor 420 are activated, FXF driver 305-a may output a voltage associated with the second voltage source.

FX driver 310-a may include a FXDR low transistor 425, low float transistor 410-b, high float transistor 415-b, and a FXDR high transistor 430. The FXDR low transistor 425 may selectively couple (e.g., via a FXDR signal) a first voltage source (e.g., a VCCP source) with a terminal of low float transistor 410-b. Low float transistor 410-b may selectively couple (e.g., via a FXFLT signal) the FXDR low transistor 425 with FX line 320-a and high float transistor 415-b. High float transistor 415-b may selectively couple (e.g., via a FXFLTF signal) the FXDR high transistor 430 with FX line 320-a and low float transistor 410-b. FXDR high transistor 430 may selectively couple (e.g., a FXDR signal) a second voltage source (e.g., a VSS source) with high float transistor 415-b. In cases where both the FXDR low transistor 425 and low float transistor 410-b are activated, FX driver 310-a may output a voltage associated with the first voltage source. In cases where both high float transistor 415-b and the FXDR high transistor 430 are activated, FX driver 310-a may output a voltage associated with the second voltage source.

Figure 5A:
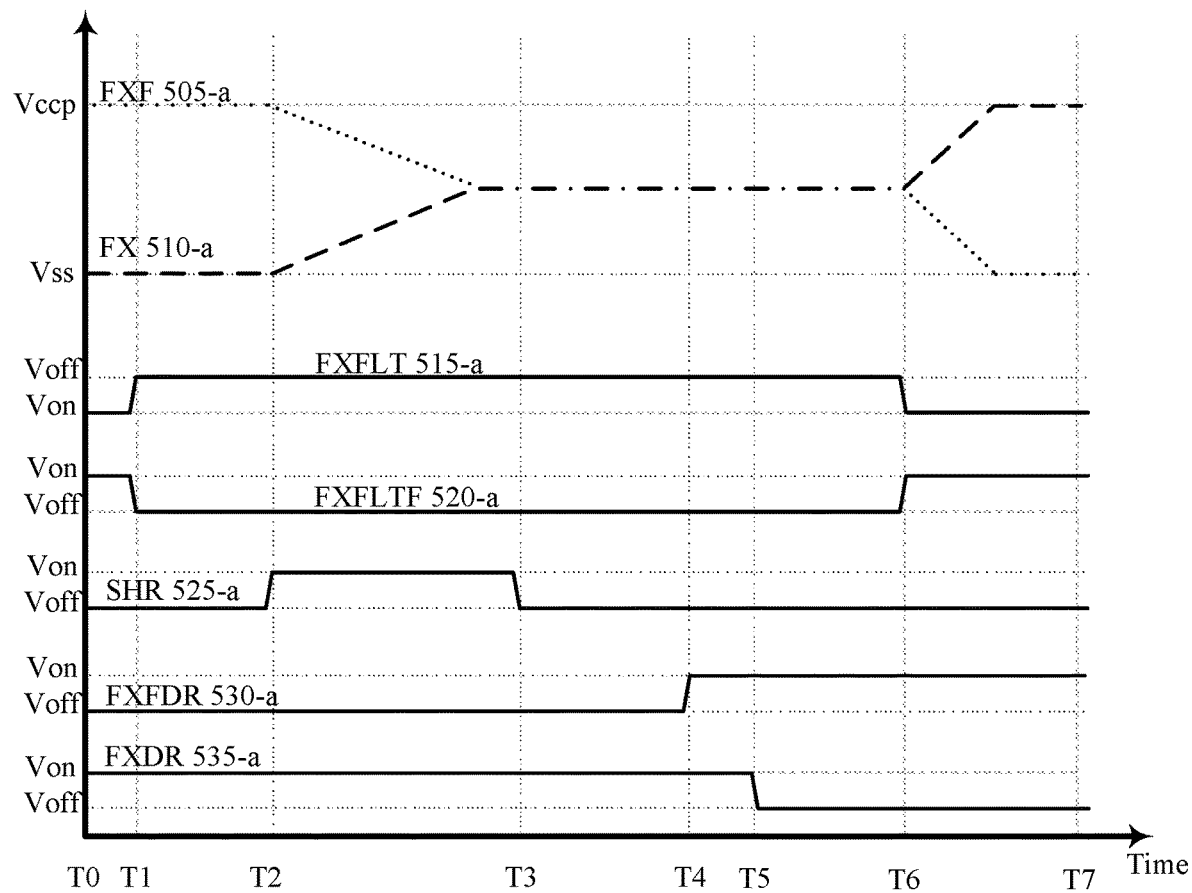
FIGS. 5A and 5B illustrate examples of timing diagrams that support phase charge sharing as disclosed herein.

FIG. 5A illustrates a timing diagram 500-a that supports phase charge sharing (e.g., for memory cell access operations, which may include IDD0, and/or memory refresh operations, which may include IDD5B) as disclosed herein (e.g., with reference to FIGS. 1-4). The timing diagram 500-a may illustrate an activate operation associated with an array of memory cells. The principles of operation described herein for the activate operation may apply to other operations as well. For example, at least some of the principles of operation may apply to a read operation, a write operation, a refresh operation, a pre-charge operation, or combinations thereof. The timing diagram 500-a shows various voltage levels (e.g., voltage signals as a function of time) associated with the components and the nodes of the driver configuration 400 described with reference to FIG. 4 to illustrate performing an activate operation. Thus, the timing diagram may illustrate the operation of one or more components described herein with reference to FIGS. 1-4. The time and voltage scales used in FIG. 5A are for illustration purposes and may not necessarily depict particular values in some cases.

The timing diagram includes a representations of voltages one or more conductive lines of a decoder during an operation (e.g., the activate operation). For example, FXF 505-a (e.g., a voltage of F×F line 315-a), FX 510-a (e.g., a voltage of FX line 320-a), FXFLT 515-a (e.g., a voltage applied to a gate of low float transistor 410-a and a gate of low float transistor 410-b), FXFLTF 520-a (a voltage applied to a gate of high float transistor 415-a and a gate of high float transistor 415-b), SHR 525-a (e.g., a voltage applied to a gate of equalizing transistor 325-a), FXFDR 530-a (e.g., a voltage applied to a gate of the FXFDR low transistor 405 and a gate of the FXFDR high transistor 420), and FXDR 535-a (e.g., a voltage applied to a gate of the FXDR low transistor 425 and a gate of the FXDR high transistor 430).

At T0, components of the decoder may initially be at certain voltage levels. For example, low float transistor 410-a, high float transistor 415-a, and FXFDR low transistor 405 may be active (e.g., due to FXFLT 515-a being at a low voltage, FXFLTF 520-a being at a high voltage, and FXFDR 530-a being at a low voltage, respectively). As a result, a voltage to activate third access driver line transistor 340-a (e.g., a high voltage, such as VCCP) may be initially applied to the F×F line 315-a (e.g., due to low float transistor 410-a and FXFDR low transistor 405 providing a path between FxF line 315-*a* and a VCCP source associated with FXF driver 305-*a*). Further, low float transistor 410-*b*, high float transistor 415-*b*, and FXDR high transistor 430 may be active or become activated (e.g., due to FXFLT 515-*a* being at a low voltage, FXFLTF 520-*a* being at a high voltage, and FXDR 535-*a* being at a high voltage, respectively). As a result, a voltage (e.g., VSS) may be applied to the FX line 320-*a* (e.g., due to FXDR high transistor 430 and high float transistor 415-*b* providing a path between FX line 320-*a* and a VSS source associated with FX driver 310-*a*).

At T1, FxF line 315-*a* and/or FX line 320-*a* may transition into a floating state. For example, low float transistor 410-*a*, high float transistor 415-*a*, low float transistor 410-*b*, and high float transistor 415-*b* may be deactivated (e.g., due to FXFLT 515-*a* transitioning to a high voltage and FXFLTF 520-*a* transitioning to a low voltage). Deactivating low float transistor 410-*a* and high float transistor 415-*a* may hold FxF line 315-*a* in a floating state and deactivating low float transistor 410-*b* and high float transistor 415-*b* may hold FX line 320-*a* in a floating state. In between T1 and T2, FXF 505-*a* and FX 510-*a* may remain at approximately unchanged values.

At T2, charge sharing and/or voltage transfer between FxF line 315-*a* and FX line 320-*a* may begin. For example, equalizing transistor 325-*a* may be activated (e.g., due to SHR 525-*a* transitioning to a high value). Activating equalizing transistor 325-*a* may couple FxF line 315-*a* and FX line 320-*a*. When FxF line 315-*a* and FX line 320-*a* are coupled, FxF line 315-*a* and FX line 320-*a* may begin exchanging charge (e.g., due to a potential difference between FXF 505-*a* and FX 510-*a*). As a result of exchanging charge, FXF 505-*a* may decrease and FX 510-*a* may increase.

At T3, charge sharing and/or voltage transfer between FxF line 315-*a* and FX line 320-*a* may cease. For example, equalizing transistor 325-*a* may be deactivated (e.g., due to SHR 525-*a* transitioning to a low value). Deactivating equalizing transistor 325-*a* may decouple FxF line 315-*a* and FX line 320-*a* and may cease the exchange of charge between FxF line 315-*a* and FX line 320-*a*. Although FIG. 5A depicts a case where FXF 505-*a* and FX 510-*a* settle to an equal voltage value before T3, there may be some cases where FXF 505-*a* and FX 510-*a* do not settle to equal voltage values (e.g., if the time between T2 and T3 is too short for FxF line 315-*a* and FX line 320-*a* to finish exchanging charge).

At T4, a voltage applied to one or more components of FXF driver 305-*a* (e.g., FXFDR 530-*a*) may transition to another voltage level, which may activate or deactivate the one or more components. For example, FXFDR low transistor 405 may be deactivated and FXFDR high transistor 420 may be activated (e.g., FXFDR 530-*a* may transition from a low voltage value to a high voltage value). Between T4 and T6, the voltage on FxF line 315-*a* (e.g., FXF 505-*a*) may be unaffected by the deactivation of FXFDR low transistor 405 and the activation of FXFDR high transistor 420, which may be due to low float transistor 410-*a* and high float transistor 415-*a* still being deactivated (e.g., FXFLT 515-*a* is still at a high voltage and FXFLTF 520-*a* is still at a low voltage).

At T5, a voltage applied to one or more components of FX driver 310-*a* (e.g., FXDR 535-*a*) may transition to another voltage level, which may activate or deactivate the one or more components. For example, FXDR high transistor 430 may be deactivated and FXDR low transistor 425 may be activated (e.g., FXDR 535-*a* may transition from a high voltage value to a low voltage value). Between T5 and T6, the voltage on FX line 320-*a* (e.g., FX 510-*a*) may be unaffected by the deactivation of FXDR high transistor 430 and the activation of FXDR low transistor 425, which may be due to low float transistor 410-*b* and high float transistor 415-*b* still being deactivated (e.g., FXFLT 515-*a* is still at a high voltage and FXFLTF 520-*a* is still at a low voltage). In some cases, the operations of T5 may occur prior to the operations of T4 or may occur concurrently with the operations of T4.

At T6, FxF line 315-*a* and/or FX line 320-*a* may transition out of a floating state. For example, low float transistor 410-*a*, high float transistor 415-*a*, low float transistor 410-*b*, and high float transistor 415-*b* may be reactivated (e.g., due to FXFLT 515-*a* transitioning to a low voltage and FXFLTF 520-*a* transitioning to a high voltage). Reactivating high float transistor 415-*a* may enable a change in voltage on FxF line 315-*a*. For instance, both FXFDR high transistor 420 and high float transistor 415-*a* may be activated and may connect a low voltage source (e.g., VSS) to FxF line 315-*a*. As a result, the voltage on FxF line 315-*a* (e.g., FXF 505-*a*) may decrease. Reactivating low float transistor 410-*b* may enable a change in voltage on FX line 320-*a*. For instance, both FXDR low transistor 425 and low float transistor 410-*b* may be activated and may connect a high voltage source (e.g., VCCP) to FX line 320-*a*. As a result, the voltage on FX line 320-*a* (e.g., FX 510-*a*) may increase. Prior to T7, the voltage on FxF line 315-*a* may settle at a low voltage (e.g., FXF 505-*a* may settle at VSS) and the voltage on FX line 320-*a* may settle at a high voltage (e.g., FX 510-*a* may settle at VCCP).

Figure 5B:
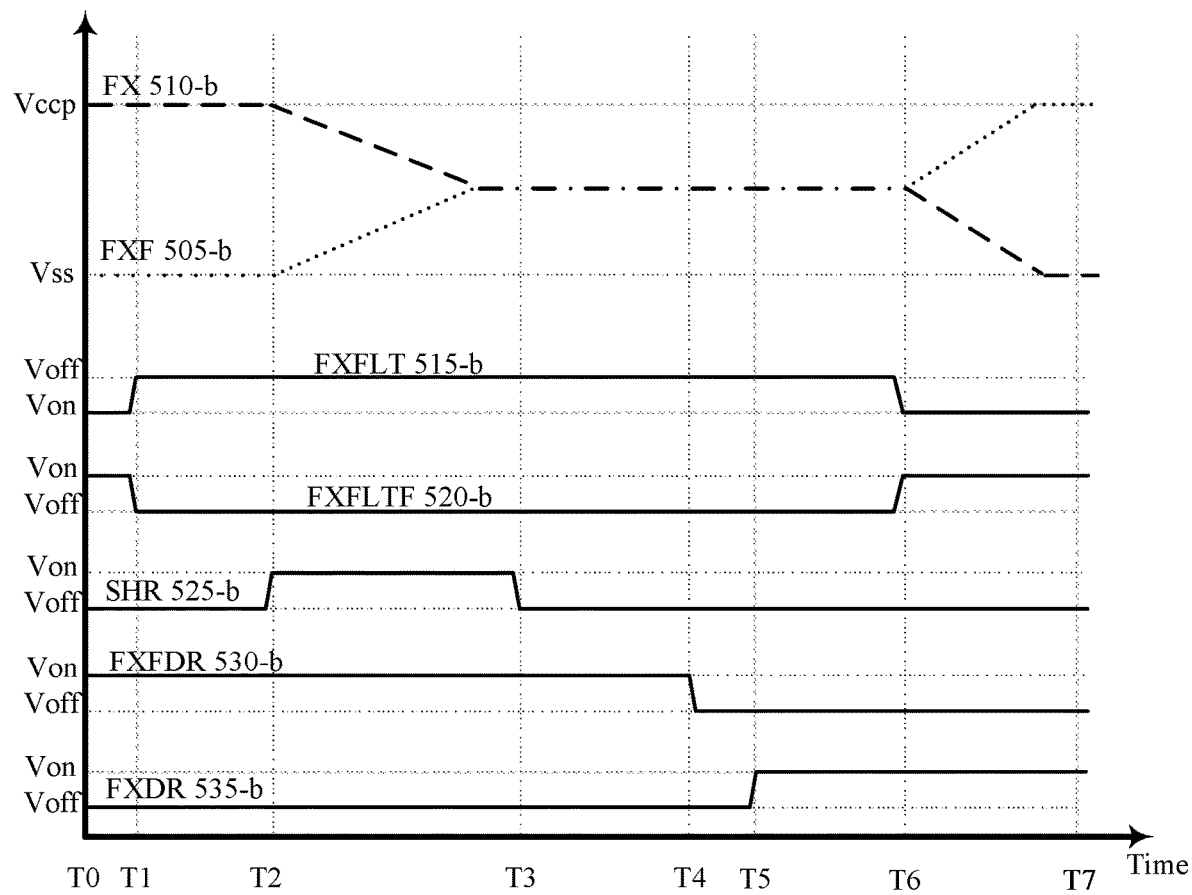

FIG. 5B illustrates a timing diagram 500-*b* that supports phase charge sharing (e.g., for memory cell access operations, which may include IDD0, and/or memory refresh operations, which may include IDD5B) as disclosed herein (e.g., with reference to FIGS. 1-4). The timing diagram 500-*b* illustrates a pre-charge operation. The timing diagram 500-*b* shows various voltage levels (e.g., voltage signals as a function of time) associated with the components and the nodes of the driver configuration 400 described with reference to FIG. 4 to illustrate performing a pre-charge operation. Thus, the timing diagram may illustrate the operation of one or more components described herein with reference to FIGS. 1-4. The time and voltage scales used in FIG. 5B are for illustration purposes and may not necessarily depict particular values in some cases.

The timing diagram includes FXF 505-*b* (e.g., a voltage of FxF line 315-*a*), FX 510-*b* (e.g., a voltage of FX line 320-*a*), FXFLT 515-*b* (e.g., a voltage applied to a gate of low float transistor 410-*a* and a gate of low float transistor 410-*b*), FXFLTF 520-*b* (a voltage applied to a gate of high float transistor 415-*a* and a gate of high float transistor 415-*b*), SHR 525-*b* (e.g., a voltage applied to a gate of equalizing transistor 325-*a*), FXFDR 530-*b* (e.g., a voltage applied to a gate of the FXFDR low transistor 405 and a gate of the FXFDR high transistor 420), and FXDR 535-*b* (e.g., a voltage applied to a gate of the FXDR low transistor 425 and a gate of the FXDR high transistor 430).

At T0, components of the decoder may initially be at certain voltage levels. For example, low float transistor 410-*a*, high float transistor 415-*a*, and FXFDR high transistor 420 may be active or become activated (e.g., due to FXFLT 515-*b* being at a low voltage, FXFLTF 520-*b* being at a high voltage, and FXFDR 530-*b* being at a high voltage, respectively). As a result, a low voltage to deactivate third access driver line transistor 340-*a* (e.g., a low voltage, such as VSS) may be initially applied to FxF line 315-*a* (e.g., due to FXFDR high transistor 420 and high float transistor 415-*a* providing a path between F×F line 315-*a* and a VSS source associated with FXF driver 305-*a*). Further, at T0, low float transistor 410-*b*, high float transistor 415-*b*, and FXDR low transistor 425 may be active or become activated (e.g., due to FXFLT 515-*b* being at a low voltage, FXFLTF 520-*b* being at a high voltage, and FXDR 535-*b* being at a low voltage, respectively). As a result, a high voltage (e.g., VCCP) may be applied to the FX line 320-*a* (e.g., due to low float transistor 410-*b* and FXDR low transistor 425 providing a path between FX line 320-*a* and a VCCP source associated with FX driver 310-*a*).

At T1, F×F line 315-*a* and/or FX line 320-*a* may transition into a floating state. For example, low float transistor 410-*a*, high float transistor 415-*a*, low float transistor 410-*b*, and high float transistor 415-*b* may be deactivated (e.g., due to FXFLT 515-*b* transitioning to a high voltage and FXFLTF 520-*b* transitioning to a low voltage). Deactivating low float transistor 410-*a* and high float transistor 415-*a* may hold F×F line 315-*a* in a floating state and deactivating low float transistor 410-*b* and high float transistor 415-*b* may hold FX line 320-*a* in a floating state. In between T1 and T2, FXF 505-*b* and FX 510-*b* may remain at approximately the same value.

At T2, charge sharing and/or voltage transfer between F×F line 315-*a* and FX line 320-*a* may begin. For example, equalizing transistor 325-*a* may be activated (e.g., due to SHR 525-*b* transitioning to a high value). Activating equalizing transistor 325-*a* may couple F×F line 315-*a* and FX line 320-*a*. When F×F line 315-*a* and FX line 320-*a* are coupled, F×F line 315-*a* and FX line 320-*a* may begin exchanging charge (e.g., due to a potential difference between FXF 505-*b* and FX 510-*b*). As a result of exchanging charge, FXF 505-*a* may increase and FX 510-*a* may decrease.

At T3, charge sharing and/or voltage transfer between F×F line 315-*a* and FX line 320-*a* may cease. For example, equalizing transistor 325-*a* may be deactivated (e.g., due to SHR 525-*b* transitioning to a low value). Deactivating equalizing transistor 325-*a* may decouple F×F line 315-*a* and FX line 320-*a* and may cease the exchange of charge between F×F line 315-*a* and FX line 320-*a*. Although FIG. 5A depicts a case where FXF 505-*b* and FX 510-*b* settle to an equal voltage value before T3, there may be some cases where FXF 505-*b* and FX 510-*b* do not settle to equal voltage values (e.g., the time between T2 and T3 is too short for F×F line 315-*a* and FX line 320-*a* to finish exchanging charge).

At T4, a voltage applied to one or more components of FXF driver 305-*a* (e.g., FXFDR 530-*b*) may transition to another voltage level, which may activate or deactivate the one or more components. For example, FXFDR high transistor 420 may be deactivated and FXFDR low transistor 405 may be activated (e.g., FXFDR 530-*b* may transition from a high voltage value to a low voltage value). Between T5 and T6, the voltage on F×F line 315-*a* (e.g., FXF 505-*b*) may be unaffected by the deactivation of FXFDR high transistor 420 and the activation of FXFDR low transistor 405, which may be due to low float transistor 410-*a* and high float transistor 415-*a* still being deactivated (e.g., FXFLT 515-*b* is still at a high voltage and FXFLTF 520-*b* is still at a low voltage).

At T5, a voltage applied to one or more components of FX driver 310-*a* (e.g., FXDR 535-*b*) may transition to another voltage level, which may activate or deactivate the one or more components. For example, FXDR low transistor 425 may be deactivated and FXDR high transistor 430 may be activated (e.g., FXDR 535-*b* may transition from a low voltage value to a high voltage value). Between T4 and T6, the voltage on FX line 320-*a* (e.g., FX 510-*b*) may be unaffected by the deactivation of FXDR low transistor 425 and the activation of FXDR high transistor 430, which may be due to low float transistor 410-*b* and high float transistor 415-*b* still being deactivated (e.g., FXFLT 515-*b* is still at a high voltage and FXFLTF 520-*b* is still at a low voltage). In some cases, the operations of T5 may occur prior to the operations of T4 or may occur concurrently with the operations of T4.

At T6, F×F line 315-*a* and/or FX line 320-*a* may transition out of a floating state. For example, low float transistor 410-*a*, high float transistor 415-*a*, low float transistor 410-*b*, and high float transistor 415-*b* may be reactivated (e.g., due to FXFLT 515-*b* transitioning to a low voltage and FXFLTF 520-*b* transitioning to a high voltage). Reactivating low float transistor 410-*a* may enable a change in voltage on F×F line 315-*a*. For instance, both FXFDR low transistor 405 and low float transistor 410-*a* may be activated and may connect a high voltage source (e.g., VCCP) to F×F line 315-*a*. As a result, the voltage on F×F line 315-*a* (e.g., FXF 505-*b*) may increase. Reactivating high float transistor 415-*b* may enable a change in voltage on FX line 320-*a*. For instance, both FXDR high transistor 430 and high float transistor 415-*b* may be activated and may connect a low voltage source (e.g., VSS) to FX line 320-*a*. As a result, the voltage on FX line 320-*a* (e.g., FX 510-*b*) may decrease. Prior to T7, the voltage on F×F line 315-*a* may settle at a high voltage (e.g., FXF 505-*b* may settle at VCCP) and the voltage on FX line 320-*a* may settle at a low voltage (e.g., FX 510-*b* may settle at VSS).

Figure 6A:
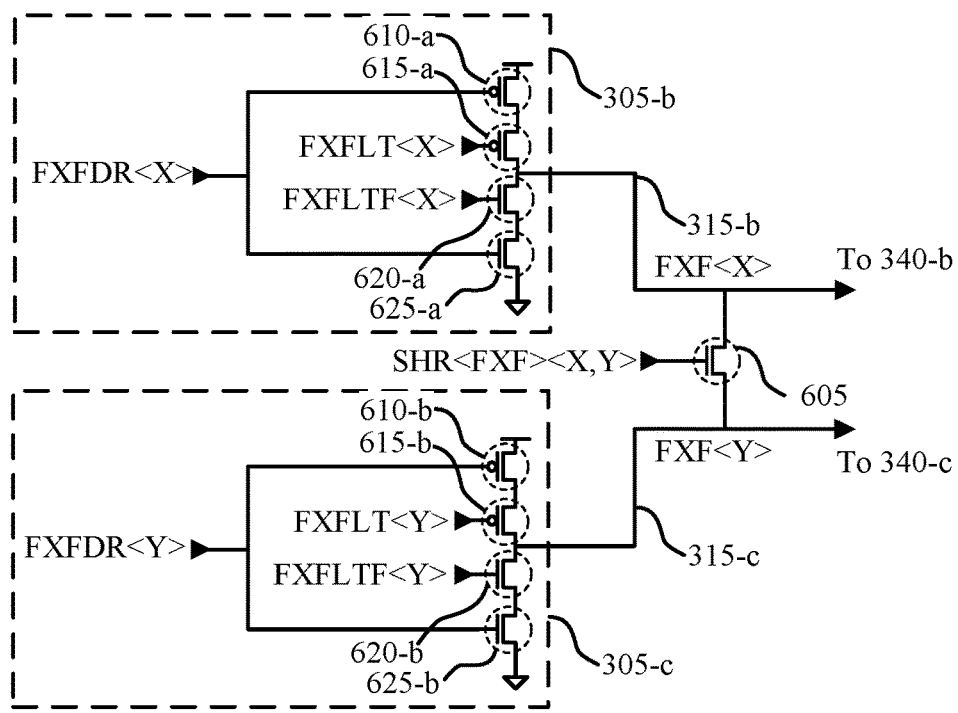
FIGS. 6A and 6B illustrate examples of driver configurations that support phase charge sharing as disclosed herein.

FIG. 6A illustrates an example of a driver configuration 600-*a* that supports phase charge sharing (e.g., for memory refresh operations, which may include IDD5B) as disclosed herein. In some examples, driver configuration 600-*a* may include one or more components described herein with reference to FIGS. 1-3. For example, the driver configuration 600-*a* may include an FXF driver 305-*b* and an FXF driver 305-*c*, which may be examples of FXF drivers 305 as described with reference to FIG. 3; and an F×F line 315-*b* and an F×F line 315-*c*, which may be examples of F×F lines 315 as described with reference to FIG. 3. Driver configuration 600-*a* further includes an FXF equalizing transistor 605, which may selectively couple F×F line 315-*b* and F×F line 315-*c*.

FXF driver 305-*b* may be the Xth FXF driver 305 out of a set of FXF drivers 305 and may include FXFDR low transistor 610-*a*, low float transistor 615-*a*, high float transistor 620-*a*, and FXFDR high transistor 625-*a*. FXFDR low transistor 610-*a* may selectively couple a first voltage source (e.g., a VCCP source) with a terminal of low float transistor 615-*a* (e.g., via a FXFDR<X> signal). Low float transistor 615-*a* may selectively couple (e.g., via a FXFLT<X> signal) a terminal of FXFDR low transistor 610-*a* with F×F line 315-*b* and a terminal of high float transistor 620-*a*. High float transistor 620-*a* may selectively couple (e.g., via a FXFLTF<X> signal) a terminal of FXFDR high transistor 625-*a* with F×F line 315-*b* and a terminal of first low float transistor 615-*a*. FXFDR high transistor 625-*a* may selectively couple (e.g., via a FXFDR<X> signal) a second voltage source (e.g., a VSS source) with a terminal of high float transistor 620-*a*. In cases where both FXFDR low transistor 610-*a* and low float transistor 615-*a* are activated, FXF driver 305-*b* may output a voltage associated with the first voltage source. In cases where both high float transistor 620-*a* and FXFDR high transistor 625-*a* are activated, FXF driver 305-*b* may output a voltage associated with the second voltage source. In some cases, FXF driver 305-*b* may be associated with FX driver 310-*b* (e.g., FXFLT<X> and FXFLTF<X> signals sent to FXF driver 305-*b* may also be sent to FX driver 310-*b*).

FXF driver 305-*c* may be the Yth FXF driver 305 out of the set of FXF drivers 305 and may include FXFDR low transistor 610-*b*, low float transistor 615-*b*, high float transistor 620-*b*, and FXFDR high transistor 625-*b*. FXFDR low transistor 610-*b* may selectively couple a first voltage source (e.g., a VCCP source) with a terminal of low float transistor 615-*b* (e.g., via a FXFDR<Y> signal). Low float transistor 615-*b* may selectively couple (e.g., via a FXFLT<Y> signal) a terminal of FXFDR low transistor 610-*b* with F×F line 315-*c* and a terminal of high float transistor 620-*b*. High float transistor 620-*b* may selectively couple (e.g., via a FXFLTF<Y> signal) a terminal of FXFDR high transistor 625-*b* with F×F line 315-*c* and a terminal of first low float transistor 615-*b*. FXFDR high transistor 625-*b* may selectively couple (e.g., via a FXFDR<Y> signal) a second voltage source (e.g., a VSS source) with a terminal of high float transistor 620-*b*. In cases where both the FXFDR low transistor 610-*b* and low float transistor 615-*b* are activated, FXF driver 305-*c* may output a voltage associated with the first voltage source. In cases where both high float transistor 620-*b* and FXFDR high transistor 625-*b* are activated, FXF driver 305-*c* may output a voltage associated with the second voltage source. In some cases, FXF driver 305-*c* may be associated with FX driver 310-*c* (e.g., FXFLT<Y> and FXFLTF<Y> signals sent to FXF driver 305-*c* may also be sent to FX driver 310-*c*).

FXF driver 305-*b* and FXF driver 305-*c* may participate in one or more memory cell operations. Before, during, or after one or more of such memory cell operations, FXF driver 305-*b* and FXF driver 305-*c* may exchange charge and/or transfer voltage (e.g., via FXF equalizing transistor 605). One example of such an operation may be a memory refresh, which may be an operation associated with preserving values stored in memory cells by overwriting a current value in a memory cell with the same value. In some cases, a memory refresh (i.e., a refresh operation) may be performed over a refresh pump, which may be a duration for the memory refresh operation. Each refresh pump may be directed to a different FXF driver 305. For instance, a first refresh pump may be directed towards FXF driver 305-*b* and a second refresh pump may be directed towards FXF driver 305-*c*. After a refresh pump associated with FXF driver 305-*b* occurs, a voltage of F×F line 315-*b* may change (e.g., increase) and a voltage of F×F line 315-*c* may change (e.g., decrease). These change in voltages may occur primarily or completely between refresh pumps.

In some cases, an FXF equalizing transistor 605 may selectively couple F×F line 315-*b* with F×F line 315-*c*. For instance, the FXF equalizing transistor 605 may couple F×F line 315-*b* with F×F line 315-*c* in between refresh pumps upon activation (e.g., by a SHR<FXF><X,Y> signal). Upon being coupled, F×F line 315-*b* and F×F line 315-*c* may exchange charge and/or transfer voltage, and the difference in voltage between each F×F line 315 may decrease. In some cases, FXF equalizing transistor 605 may be activated while F×F line 315-*b* and F×F line 315-*c* are held in a floating state.

In some cases, a first FXF driver 305 involved in a first refresh pump may share charge and/or transfer voltage with a second FXF driver 305 according to whether the second FXF driver 305 is involved in a next refresh pump. As such, the FXF driver 305 that the first FXF driver 305 shares charge and/or transfer voltage with may be determined based on the location of the FXF driver 305 associated with the next refresh pump. In one example, if a current refresh pump involves the Nth FXF driver 305 of a set of FXF driver 305, the Nth FXF driver 305 may share charge and/or transfer voltage with the (N+M)th FXF driver 305 (or, in some cases, the modulo of the (N+M)th FXF driver 305 over the total number of FXF drivers 305), where M is an integer. For instance, if FXF driver 305-*b* shares charge and/or transfers voltage with FXF driver 305-*c*, then Y may equal X+M (e.g., if M=1, Y=X+1). In some cases, M may be constant for each refresh pump. For instance, if M=1, the 1st FXF driver 305 may share charge and/or transfer voltage with the 2nd FXF driver 305, the 2nd may share charge and/or transfer voltage with the 3rd, and so on. This process may continue until the last FXF driver 305 and/or final refresh pump or may wrap around from the last FXF driver 105 (e.g., the last FXF driver 305 may share charge with the 1st FXF driver 305), at which point the process may repeat; continue for some number of refresh pumps and/or FXF drivers 305; or cease. In some cases, wrapping around may occur if the last FXF driver 305 and the first FXF driver 305 are in adjacent refresh pumps during the same refresh (e.g., if the first refresh pump involves a FXF driver 305 that is not the 1st FXF driver 305). Additionally or alternatively, M may change or alternate according to a function (e.g., a function of the total number of refresh pumps, the total number of FXF drivers 305 within the set of FXF driver 305, the index of a refresh pump, the index of a FXF driver 305 within the set of FXF drivers 305, or a combination thereof). It should be noted that M may additionally or alternatively depend on the total number of FX drivers 310 within a set of FX drivers 310 and/or the index of a FX driver 310 within the set of FX drivers 310 (e.g., due to an association of FXF drivers 305 with respective FX drivers 310).

In general, each pair of FXF drivers 305 (e.g., the FXF driver 305 of the first refresh pump and the FXF driver 305 of the next refresh pump) may have a unique FXF equalizing transistor 605 and receive a unique SHR<FXF> signal. For instance, the FXF equalizing transistor 605 used with the Nth FXF driver 305 and the (N+M)th FXF driver 305 may be different from the FXF equalizing transistor 605 of the Nth FXF driver 305 and (N+M+1)th FXF driver 305. Additionally, the signaling sent to the FXF equalizing transistor 605 used with the Nth FXF driver 305 and the (N+M)th FXF driver 305 (e.g., SHR<FXF><N,N+M>) may be controlled independently from the signaling sent to the FXF equalizing transistor 605 of the Nth FXF driver 305 and (N+M+1)th FXF driver 305 (e.g., SHR<FXF><N,N+M+1>). Additionally or alternatively, in between each refresh pump, a new FXF equalizing transistor 605 and respective signaling may be utilized. For instance, a Pth FXF driver 305 may be involved in a first refresh pump, a Qth FXF driver 305 may be involved in a second refresh pump subsequent to the first, and a Rth FXF driver 305 may be involved in a third refresh pump subsequent to the second. A first FXF equalizing transistor 605 may couple a F×F line 315 of the Pth FXF driver 305 with a F×F line 315 of the Qth FXF driver 305 (e.g., via SHR<FXF><P,Q>) in between the first and second refresh pumps, and a second, distinct FXF equalizing transistor 605 may couple a F×F line 315 of the Qth FXF driver 305 with a F×F line 315 of the Rth FXF driver 305 (e.g., via SHR<FXF><Q,R>) in between the second and third refresh pumps.

Exchanging charge and/or transferring voltage (e.g., via FXF equalizing transistor 605) between F×F line 315-*b* and the F×F line 315-*c* may decrease the potential difference between FxF line 315-*b* and FxF line 315-*c*, which may reduce an amount of charge or a duration of a current supplied from FXF driver 305-*b* and/or FXF driver 305-*c* to reach voltages associated with a memory cell operation. Reducing the amount of supplied charge may reduce power consumption. Such coupling may, further, reduce latency or errors associated with performing memory cell operations. In some cases, FXF driver 305-*b* and FXF driver 305-*c* may have matched capacitive loads. The matched capacitive loads may enable increased power savings from the methods disclosed herein.

Figure 6B:
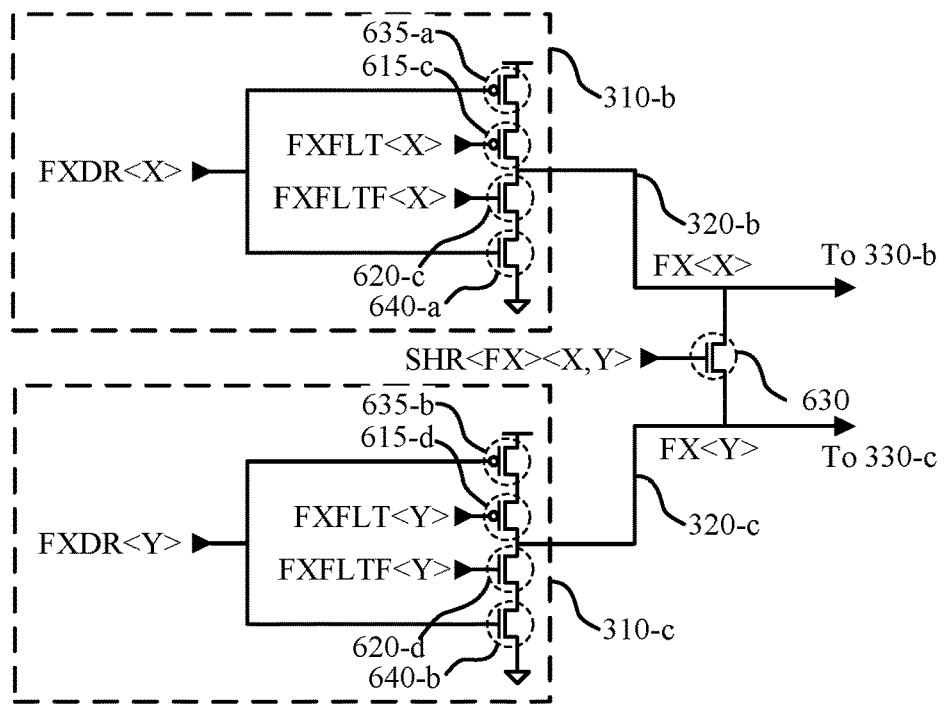

FIG. 6B illustrates an example of a driver configuration 600-*b* that supports phase charge sharing (e.g., for memory refresh operations, which may include IDD5B) as disclosed herein. In some examples, driver configuration 600-*b* may include one or more components described herein with reference to FIGS. 1-3. For example, the driver configuration 600-*b* may include a FX driver 310-*b* and a FX driver 310-*c*, which may be examples of FX drivers 310 as described with reference to FIG. 3; and a FX line 320-*b* and a FX line 320-*c*, which may be examples of FX lines 320 as described with reference to FIG. 3. Driver configuration 600-*b* further includes a FX equalizing transistor 630, which may selectively couple FX line 320-*b* and FX line 320-*c*.

FX driver 310-*b* may be the Xth FX driver 310 out of a set of FX drivers 310 and may include FXDR low transistor 635-*a*, low float transistor 615-*c*, high float transistor 620-*c*, and FXDR high transistor 640-*a*. FXDR low transistor 635-*a* may selectively couple (e.g., via a FXDR<X> signal) a first voltage source (e.g., a VCCP source) with a terminal of low float transistor 615-*c*. Low float transistor 615-*c* may selectively couple (e.g., via a FXFLT<X> signal) a terminal of FXDR low transistor 635-*a* with FX line 320-*b* and a terminal of high float transistor 620-*c*. High float transistor 620-*c* may selectively couple (e.g., via a FXFLTF<X> signal) a terminal of FXDR high transistor 640-*a* with FX line 320-*b* and a terminal of low float transistor 615-*c*. The FXDR high transistor 640-*a* may selectively couple (e.g., via a FXDR<X> signal) a second voltage source (e.g., a VSS source) with a terminal of high float transistor 620-*c*. In cases where both the FXDR low transistor 635-*a* and low float transistor 615-*c* are activated, FX driver 310-*b* may output a voltage associated with the first voltage source. In cases where both high float transistor 620-*c* and FXDR high transistor 640-*a* are activated, FX driver 310-*b* may output a voltage associated with the second voltage source. In some cases, FX driver 310-*b* may be associated with FXF driver 305-*b* (e.g., FXFLT<X> and FXFLTF<X> signals sent to FX driver 310-*b* may also be sent to FXF driver 305-*b*).

FX driver 310-*c* may be the Yth FX driver 310 out of the set of FX drivers 310 and may include FXDR low transistor 635-*b*, low float transistor 615-*d*, high float transistor 620-*d*, and FXDR high transistor 640-*b*. FXDR low transistor 635-*b* may selectively couple (e.g., via a FXDR<Y> signal) a first voltage source (e.g., a VCCP source) with a terminal of low float transistor 615-*d*. Low float transistor 615-*d* may selectively couple (e.g., via a FXFLT<Y> signal) a terminal of FXDR low transistor 635-*b* with FX line 320-*c* and a terminal of high float transistor 620-*d*. High float transistor 620-*d* may selectively couple (e.g., via a FXFLTF<Y> signal) a terminal of FXDR high transistor 640-*b* with FX line 320-*c* and a terminal of low float transistor 615-*d*. The FXDR high transistor 640-*c* may selectively couple (e.g., via a FXDR<Y> signal) a second voltage source (e.g., a VSS source) with a terminal of high float transistor 620-*d*. In cases where both the FXDR low transistor 635-*b* and low float transistor 615-*d* are activated, FX driver 310-*c* may output a voltage associated with the first voltage source. In cases where both high float transistor 620-*d* and FXDR high transistor 640-*b* are activated, FX driver 310-*c* may output a voltage associated with the second voltage source. In some cases, FX driver 310-*c* may be associated with FXF driver 305-*c* (e.g., FXFLT<Y> and FXFLTF<Y> signals sent to FX driver 310-*c* may also be sent to FXF driver 305-*c*).

FX driver 310-*b* and FX driver 310-*c* may participate in one or more memory cell operations. Before, during, or after one or more of such memory cell operations, FX driver 310-*b* and FX driver 310-*c* may exchange charge and/or transfer voltage (e.g., via FX equalizing transistor 630). One example of such an operation may be a memory refresh. Each refresh pump of the memory refresh may be directed to a different FX driver 310. For instance, a first refresh pump may be directed towards FX driver 310-*b* and a second refresh pump may be directed towards FX driver 310-*c*. After a refresh pump associated with a FX driver 310-*b* occurs, a voltage of FX line 320-*b* may change (e.g., decrease) and a voltage of FX line 320-*c* may change (e.g., increase). This change of voltages may occur primarily or completely between refresh pumps.

In some cases, a FX equalizing transistor 630 may selectively couple FX line 320-*b* with FX line 320-*c*. For instance, the FX equalizing transistor 630 may couple FX line 320-*b* with FX line 320-*c* in between refresh pumps upon activation (e.g., by a SHR<FX><X,Y> signal). Upon being coupled, FX line 320-*b* and FX line 320-*c* may exchange charge and/or transfer voltage, and the difference in voltage between each FX line 320 may decrease. In some cases, FX equalizing transistor 630 may be activated while FX line 320-*b* and FX line 320-*c* are held in a floating state.

In some cases, a first FX driver 310 involved in a first refresh pump may share charge and/or transfer voltage with a second FX driver 310 according to whether the second FX driver 310 is involved in a next refresh pump. As such, the FX driver 310 that the first FX driver 310 shares charge and/or transfers voltage with may be determined based on the location of the FX driver 310 associated with the next refresh pump. In one example, if a current refresh pump involves the Nth FX driver 310 of a set of FX drivers 310, the Nth FX driver 310 may share charge and/or transfer voltage with the (N+M)th FX driver 310 (e.g., or, in some cases, the modulo of the (N+M)th FX driver 310 over the total number of FX drivers 310), where M is an integer. For instance, if FX driver 310-*b* shares charge and/or transfers voltage with FX driver 310-*c*, then Y may equal X+M (e.g., if M=1, Y=X+1). In some cases, M may be constant for each refresh pump. For instance, if M=1, the 1st FX driver 310 may share charge and/or transfer voltage with the 2nd FX driver 310, the 2nd may share charge and/or transfer voltage with the 3rd, and so on. This process may continue until the last FX driver 310 and/or a final refresh pump or may wrap around from the last FX driver 310 (e.g., the last FX driver 310 may share charge with the 1st FX driver 310), where the process may repeat; continue for some number of refresh pumps and/or FX drivers 310; or cease. In some cases, wrapping around may occur in cases where the last FX driver 310 and the 1st FX driver 310 are adjacent pumps during the same refresh (e.g., if the first refresh pump involves a FX driver 310 that is not the 1st FX driver 310). Additionally or alternatively, M may change or alternate according to a function (e.g., a function of the total number of refresh pumps, the total number of FX drivers 310 within the set of FX driver 310, the index of a refresh pump and/or the index of a FX driver 310 within the set of FX drivers 310). It should be noted that M may additionally or alternatively depend on the total number of FXF drivers 305 within the set of FXF drivers 305 and/or the index of a FXF driver 305 within the set of FXF drivers 305 (e.g., due to an association of FX drivers 310 with respective FXF drivers 305).

In general, each pair of FX drivers 310 (e.g., the FX driver 310 of the first refresh pump and the FX driver 310 of the next refresh pump) may have a unique FX equalizing transistor 630 and may receive a unique SHR<FX> signal. In one example, the FX equalizing transistor 630 used with the Nth FX driver 310 and the (N+M)th FX driver 310 may be different from the FX equalizing transistor 630 of the Nth FX driver 310 and (N+M+1)th FX driver 310. Additionally, the signaling sent to the FX equalizing transistor 630 used with the Nth FX driver 310 and the (N+M)th FX driver 310 (e.g., SHR<FX><N,N+M>) may be controlled independently from the signaling sent to the FX equalizing transistor 630 of the Nth FX driver 310 and (N+M+1)th FX driver 310 (e.g., SHR<FX><N,N+M+1>). Additionally or alternatively, in between each refresh pump, a new FX equalizing transistor 630 and respective signaling may be utilized. For instance, a Pth FX driver 310 may be involved in a first refresh pump, a Qth FX driver 310 may be involved in a second refresh pump subsequent to the first, and a Rth FX driver 310 may be involved in a third refresh pump subsequent to the second. A first FX equalizing transistor 630 may couple a FX line 320 of the Pth FX driver 310 with a FX line 320 of the Qth FX driver 310 (e.g., via SHR<FX><P,Q>) in between the first and second refresh pumps, and a second, distinct FX equalizing transistor 630 may couple a FX line 320 of the Qth FX driver 310 with a FX line 320 of the Rth FX driver 310 (e.g., via SHR<FX><Q,R>) in between the second and third refresh pumps.

Exchanging charge and/or transferring voltage (e.g., via FX equalizing transistor 630) between FX line 320-*b* and the FX line 320-*c* may decrease the potential difference between FX line 320-*b* and FX line 320-*c*, which may reduce an amount of charge or a duration of a current supplied by FX driver 310-*b* and/or FX driver 310-*c* while adjusting voltages. Reducing the amount of supplied charge may reduce power consumption. Such coupling may, further, reduce latency or errors associated with performing memory cell operations. In some cases, FX driver 310-*b* and FX driver 310-*c* may have matched capacitive loads. The matched capacitive loads may enable increased power savings from the methods disclosed herein.

Figure 7:
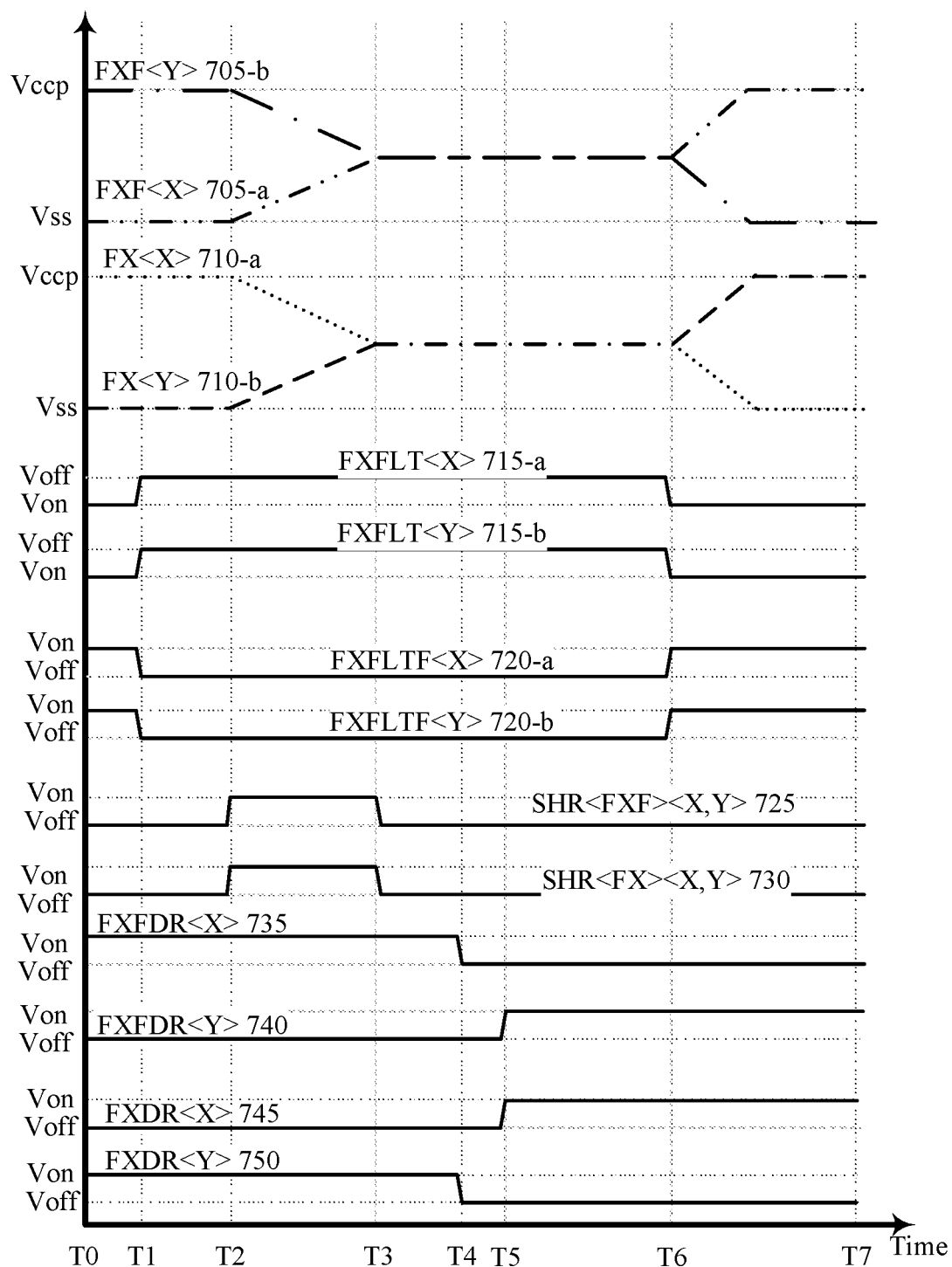
FIG. 7 illustrates an example of a timing diagram that supports phase charge sharing as disclosed herein.

FIG. 7 illustrates a timing diagram 700 that supports phase charge sharing (e.g., for memory refresh operations, which may include IDD5B) as disclosed herein (e.g., with reference to FIGS. 1-3 and 6). The timing diagram 700 illustrates an operation between refresh pumps. The timing diagram 700 shows various voltage levels (e.g., voltage signals as a function of time) associated with the components and the nodes of the driver configurations 600-*a* and 600-*b* described with reference to FIGS. 6A and 6B, respectively, to illustrate performing the operation between refresh pumps. Thus, the timing diagram may illustrate the operation of one or more components described herein with reference to FIGS. 1-3, 6A, and 6B. The time and voltage scales used in FIG. 7 are for illustration purposes and may not necessarily depict particular values in some cases.

The timing diagram includes FXF<X> 705-*a* (e.g., a voltage of F×F line 315-*b*), FXF<Y> 705-*b* (e.g., a voltage of F×F line 315-*c*), FX<X> 710-*a* (e.g., a voltage of FX line 320-*b*), FX<Y> 710-*b* (a voltage of FX line 320-*c*), FXFLT<X> 715-*a* (e.g., a voltage applied to gates of low float transistor 615-*a* and low float transistor 615-*c*), FXFLT<Y> 715-*b* (e.g., a voltage applied to gates of low float transistor 615-*b* and low float transistor 615-*d*), FXFLTF<X> 720-*a* (e.g., a voltage applied to gates of high float transistor 620-*a* and high float transistor 620-*c*), FXFLTF<Y> 720-*b* (e.g., a voltage applied to gates of high float transistor 620-*b* and high float transistor 620-*d*), SHR<FXF><X,Y> 725 (e.g., a voltage applied to a gate of FXF equalizing transistor 605), SHR<FX><X,Y> 730 (e.g., a voltage applied to a gate of FX equalizing transistor 630), FXFDR<X> 735 (e.g., a voltage applied to gates of FXFDR low transistor 610-*a* and FXFDR high transistor 625-*a*), FXFDR<Y> 740 (e.g., a voltage applied to gates of FXFDR low transistor 610-*b* and FXFDR high transistor 625-*b*), FXDR<X> 745 (e.g., a voltage applied to gates of FXDR low transistor 635-*a* and FXDR high transistor 540-*a*), and FXDR<Y> 750 (e.g., a voltage applied to gates of FXDR low transistor 635-*b* and FXDR high transistor 640-*b*).

The low float transistor 615-*a* and low float transistor 615-*c* may, in some cases, be controlled independently from low float transistor 615-*b* and low float transistor 615-*d* (e.g., FXFLT<X> 715-*a* may control low float transistors 615-*a* and 615-*c* and FXFLT<Y> 715-*b* may control low float transistors 615-*b* and 615-*d*). Further, the high float transistor 620-*a* and high float transistor 620-*c* may be controlled independently from high float transistor 620-*b* and high float transistor 620-*d* (e.g., FXFLTF<X> 720-*a* may control high float transistors 620-*a* and 620-*c* and FXFLTF<Y> 720-*b* may control high float transistors 620-*b* and 620-*d*).

In some cases, FXFDR<X> 735, FXFDR<Y> 740, FXDR<X> 745, and FXDR<Y> 750 may each be controlled independently (e.g., by a controller). For example, the values of each of these signals may be decided by independent processes (e.g., FXFDR<X> 735 may have different values than FXFDR<Y> 740). In other cases, FXFDR<X> 735 and FXFDR<Y> 740 may be controlled together and/or FXDR<X> 745 and FXDR<Y> 750 may be controlled together. For example, FXFDR<X> 735 and FXFDR<Y> 740 may be approximately the same value at each instance of time and/or FXDR<X> 745 and FXDR<Y> 750 may be approximately the same value at each instance of time. Additionally or alternatively, FXFDR<X> 735 may have an explicit or implicit relationship with FXFDR<Y> 740 and/or FXDR<X> 745 may have an explicit or implicit relationship with FXDR<Y> 750. In other cases, FXFDR<X> 735, FXFDR<Y> 740, FXDR<X> 745, and FXDR<Y> 750 may be controlled together. For example, FXFDR<X> 735 and FXFDR<Y> 740 may be at the same value at each instance of time and may be inverses of FXDR<X> 745 and FXDR<Y> 750, which may also be at the same value at each instance of time.

At T0, components of the decoder may initially be at certain voltage levels. For example, low float transistor 615-*a*, high float transistor 620-*a*, and FXFDR high transistor 625-*a* may be active (e.g., due to FXFLT<X> 715-*a* being at a low voltage, FXFLTF<X> 720-*a* being at a high voltage, and FXFDR<X> 735 being at a high voltage, respectively). As a result, a voltage to deactivate third access driver line transistor 340-*b* (e.g., a low voltage, such as VSS) may initially be applied to F×F line 315-*b* (e.g., due to FXFDR high transistor 625-*a* and high float transistor 620-*a* providing a path between F×F line 315-*b* and a VSS source associated with FXF driver 305-*b*). Further, low float transistor 615-*b*, high float transistor 620-*b*, and FXFDR low transistor 610-*b* may be active (e.g., due to FXFLT<Y> 715-*b* being at a low voltage, FXFLTF<Y> 720-*b* being at a high voltage, and FXFDR<Y> 740 being at a low voltage, respectively). As a result, a voltage to activate third access driver line transistor 340-c (e.g., a high voltage, such as VCCP) may be applied to FxF line 315-c (e.g., due to low float transistor 615-b and FXFDR low transistor 610-b providing a path between FxF line 315-c and a VCCP source associated with FXF driver 305-c).

Additionally or alternatively, at T0, low float transistor 615-c, high float transistor 620-c, and FXDR low transistor 635-a may be active (e.g., due to FXFLT<X> 715-a being at a low voltage, FXFLTF<X> 720-a being at a high voltage, and FXDR<X> 745 being at a low voltage, respectively). As a result, a high voltage (e.g., VCCP) may be applied to the FX line 320-b (e.g., due to low float transistor 615-c and FXDR low transistor 635-a providing a path between FX line 320-b and a VCCP source associated with FX driver 310-b). Further, low float transistor 615-d, high float transistor 620-d, and FXDR high transistor 640-b may be active (e.g., due to FXFLT<Y> 715-b being at a low voltage, FXFLTF<Y> 720-b being at a high voltage, and FXDR<Y> 750 being at a high voltage, respectively). As a result, a low voltage (e.g., VSS) may be applied to the FX line 320-c (e.g., due to high float transistor 620-d and FXDR high transistor 640-b providing a path between FX line 320-c and a VSS source associated with FX driver 310-c).

At T1, FxF line 315-b and/or FxF line 315-c may transition to a floating state. Additionally or alternatively, FX line 320-b and/or FX line 320-c may transition to a floating state. For example, each low float transistor 615 (e.g., low float transistor 615-a, low float transistor 615-b, low float transistor 615-c, and low float transistor 615-d) and each high float transistor 620 (e.g., high float transistor 620-a, high float transistor 620-b, high float transistor 620-c, and high float transistor 620-d) may be deactivated (e.g., due to FXFLT<X> 715-a and FXFLT<Y> 715-b transitioning to a high voltage and FXFLTF<X> 720-a and FXFLTF<Y> 720-b transitioning to a low voltage). Deactivating low float transistor 615-a and high float transistor 620-a may hold FxF line 315-b in a floating state; deactivating low float transistor 615-b and high float transistor 620-b may hold FxF line 315-c in a floating state; deactivating low float transistor 615-c and high float transistor 620-c may hold FX line 320-b in a floating state; and deactivating low float transistor 615-d and high float transistor 620-d may hold FX line 320-c in a floating state. In between T1 and T2, FX<X> 705-a, FX<Y> 705-b, FXF<X> 710-a, and FXF<Y> 710-b may remain at approximately unchanged values.

In cases where low float transistors 615-a and 615-c are controlled independently from low float transistors 615-b and 615-d (e.g., low float transistors 615-a and 615-c are controlled by FXFLT<X> 715-a and low float transistors 615-b and 615-d are controlled by FXFLT<Y> 715-b), FxF line 315-b may transition into a floating state before, concurrently with, or after FxF line 315-c and/or FX line 320-b may transition before, concurrently with, or after FX line 320-c. It should further be noted that, in cases where high float transistors 620-a and 620-c are controlled independently from high float transistors 620-b and 620-d (e.g., high float transistors 620-a and 620-c are controlled by FXFLTF<X> 720-a and high float transistors 620-b and 620-d are controlled by FXFLTF<Y> 720-b), FxF line 315-b may transition into a floating state before, concurrently with, or after FxF line 315-c and/or FX line 320-b may transition before, concurrently with, or after FX line 320-c.

At T2, charge sharing and/or voltage transfer between FxF line 315-b and FxF line 315-c may begin. Additionally or alternatively, charge sharing and/or voltage transfer between FX line 320-b and FX line 320-c may begin. For example, FXF equalizing transistor 605 and FX equalizing transistor 630 may be activated (e.g., due to SHR<FXF><X,Y> 725 and SHR<FX><X,Y> 730, respectively, transitioning to high voltage values). Activating FXF equalizing transistor 605 may couple FxF line 315-b and FxF line 315-c and activating FX equalizing transistor 630 may couple FX line 320-b and FX line 320-c. When FxF line 315-b and FxF line 315-c are coupled, FxF line 315-b and FxF line 315-c may begin exchanging charge (e.g., due to the potential difference between FXF<X> 705-a and FXF<Y> 705-b). As a result of FxF line 315-b and FxF line 315-c exchanging charge, FXF<X> 705-a may increase and FXF<Y> 705-b may decrease. Further, when FX line 320-b and FX line 320-c are coupled, FX line 320-b and FX line 320-c may begin exchanging charge (e.g., due to the potential difference between FX<X> 710-a and FX<Y> 710-b). As a result of FX line 320-b and FX line 320-c exchanging charge, FX<X> 710-a may decrease and FX<Y> 710-b may increase. SHR<FXF><X,Y> 725 and SHR<FX><X,Y> 730 may come from the same source (e.g., may both be a signal SHR<X,Y>) or may come from different sources.

At T3, charge sharing and/or voltage transfer between FxF line 315-b and FxF line 315-c may cease. Additionally or alternatively, charge sharing and/or voltage transfer between FX line 320-b and FX line 320-c may cease. For example, FXF equalizing transistor 605 and FX equalizing transistor 630 may be deactivated (e.g., due to SHR<FXF><X,Y> 725 and SHR<FX><X,Y> 730 transitioning to low voltage values, respectively). Deactivating FXF equalizing transistor 605 may decouple FxF line 315-b from FxF line 315-c and may cease the exchange of charge between FxF line 315-b and FxF line 315-c. Deactivating FX equalizing transistor 630 may decouple FX line 320-b from FX line 320-c and may cease the exchange of charge between FX line 320-b and FX line 320-c. Although FIG. 7 depicts a case where FXF<X> 705-a and FXF<Y> 705-b, as well as FX<X> 710-a and FX<Y> 710-b, settle to equal voltage values before T4, there may be some cases where FXF<X> 705-a and FXF<Y> 705-b, as well as FX<X> 710-a and FX<Y> 710-b, do not settle to equal voltage values (e.g., the time between T3 and T4 is too short for FxF line 315-b and FxF line 315-c and/or FX line 320-b and FX line 320-c to finish exchanging charge).

At T4, a voltage applied to one or more components of FXF driver 305-b (e.g., FXFDR<X> 735) may transition to another voltage level, which may activate or deactivate the one or more components. For example, FXFDR high transistor 625-a may be deactivated and FXFDR low transistor 610-a may be activated (e.g., FXFDR<X> 735 may transition from a high voltage value to a low voltage value). Between T5 and T6, the voltage on FxF line 315-b (e.g., FXF<X> 705-a) may be unaffected by the deactivation of FXFDR high transistor 625-a and the activation of FXFDR low transistor 610-a, which may be due to low float transistor 615-a and high float transistor 620-a still being deactivated (e.g., FXFLT<X> 715-a is still at a high voltage and FXFLTF<X> 720-a is still at a low voltage). Additionally or alternatively, at T5, a voltage applied to one or more components of FX driver 310-c (e.g., FXDR<Y> 750) may transition to another voltage level, which may activate or deactivate the one or more components. For example, FXDR high transistor 640-b may be deactivated and FXDR low transistor 635-b may be activated (e.g., FXDR<Y> 750 may transition from a high voltage value to a low voltage value). Between T5 and T6, the voltage on FX line 320-c (e.g., FX<Y> 710-b) may be unaffected by the deactivation of FXDR high transistor 640-b and the activation of FXDR low transistor 635-b, which may be due to low float transistor 615-*d* and high float transistor 620-*d* still being deactivated (e.g., FXFLT<Y> 715-*b* is still at a high voltage and FXFLTF<Y> 720-*b* is still at a low voltage).

At T5, a voltage applied to one or more components of FXF driver 305-*c* (e.g., FXFDR<Y> 740) may transition to another voltage level, which may activate or deactivate the one or more components. For example, FXFDR low transistor 610-*b* may be deactivated and FXFDR high transistor 625-*b* may be activated (e.g., FXFDR<Y> 740 may transition from a low voltage value to a high voltage value). Between T4 and T6, the voltage on F×F line 315-*c* (e.g., FXF<Y> 705-*b*) may be unaffected by the deactivation of FXFDR low transistor 610-*b* and the activation of FXFDR high transistor 625-*b*, which may be due to low float transistor 615-*b* and high float transistor 620-*b* still being deactivated (e.g., FXFLT<Y> 715-*b* is still at a high voltage and FXFLTF<Y> 720-*b* is still at a low voltage). Additionally or alternatively, at T4, a voltage applied to one or more components of FX driver 310-*b* (e.g., FXDR<X> 745) may transition to another voltage level, which may activate or deactivate the one or more components. For example, FXDR low transistor 635-*a* may be deactivated and FXDR high transistor 640-*a* may be activated (e.g., FXDR<X> 745 may transition from a low voltage value to a high voltage value). Between T4 and T6, the voltage on FX line 320-*b* (e.g., FX<X> 710-*a*) may be unaffected by the deactivation of FXDR low transistor 635-*b* and the activation of FXDR high transistor 640-*b*, which may be due to low float transistor 615-*c* and high float transistor 620-*c* still being deactivated (e.g., FXFLT<X> 715-*a* is still at a high voltage and FXFLTF<X> 720-*b* is still at a low voltage). In some cases, the operations of T5 may occur prior to the operations of T4 or may occur concurrently with the operations of T4. Additionally or alternatively, one or more aspects of the operation of T4 (e.g., FXFDR<X> 735 and/or FXDR<Y> 750 transitioning to a different voltage level) may occur during T5 and vice-versa (e.g., FXFDR<Y> 740 and/or FXDR<X> 745 may transition during T4).

At T6, F×F line 315-*b* and/or F×F line 315-*c* may transition out of a floating state. For example, low float transistor 615-*a*, high float transistor 620-*a*, low float transistor 615-*b*, and high float transistor 620-*b* may be reactivated (e.g., due to FXFLT<X> 715-*a* and FXFLT<Y> 715-*b* transitioning to a low voltage and FXFLTF<X> 720-*a* and FXFLTF<Y> 720-*b* transitioning to a high voltage). Reactivating low float transistor 615-*a* may enable a change in voltage on F×F line 315-*b*. For instance, both FXFDR low transistor 610-*a* and low float transistor 615-*a* may be activated and may connect a high voltage source (e.g., VCCP) to F×F line 315-*b*. As a result, the voltage on F×F line 315-*b* (e.g., FXF<X> 705-*a*) may increase. Reactivating high float transistor 620-*b* may enable a change in voltage on F×F line 315-*c*. For instance, both FXFDR high transistor 625-*b* and high float transistor 620-*b* may be activated and may connect a low voltage source (e.g., VSS) to FX line 320-*a*. As a result, the voltage on F×F line 315-*c* (e.g., FXF<Y> 705-*b*) may decrease. Prior to T7, the voltage on F×F line 315-*b* may settle at a high voltage (e.g., FXF<X> 705-*a* may settle at VCCP) and the voltage on F×F line 315-*c* may settle at a low voltage (e.g., FXF<Y> 705-*b* may settle at VSS). In cases where low float transistor 615-*a* is controlled independently from low float transistor 615-*b* (e.g., low float transistor 615-*a* is controlled by FXFLT<X> 715-*a* and low float transistor 615-*b* is controlled by FXFLT<Y> 715-*b*), F×F line 315-*b* may transition out of the floating state before, concurrently with, or after F×F line 315-*c*. It should further be noted that, in cases where high float transistor 620-*a* is controlled independently from high float transistor 620-*b* (e.g., high float transistor 620-*a* is controlled by FXFLTF<X> 720-*a* and high float transistor 620-*b* is controlled by FXFLTF<Y> 720-*b*), F×F line 315-*b* may transition out of the floating state before, concurrently with, or after F×F line 315-*c*.

Additionally or alternatively, at T6, FX line 320-*b* and/or FX line 320-*c* may transition out of a floating state. For example, low float transistor 615-*c*, high float transistor 620-*c*, low float transistor 615-*d*, and high float transistor 620-*d* may be reactivated (e.g., due to FXFLT<X> 715-*a* and FXFLT<Y>715-*b* transitioning to a low voltage and FXFLTF<X> 720-*a* and FXFLTF<Y> 720-*b* transitioning to a high voltage). Reactivating low float transistor 615-*d* may enable a change in voltage on FX line 320-*c*. For instance, both FXDR low transistor 635-*b* and low float transistor 615-*d* may be activated and may connect a high voltage source (e.g., VCCP) to FX line 320-*c*. As a result, the voltage on FX line 320-*c* (e.g., FX<Y> 710-*b*) may increase. Reactivating high float transistor 620-*c* may enable a change in voltage on FX line 320-*b*. For instance, both FXDR high transistor 640-*a* and high float transistor 620-*c* may be activated and may connect a low voltage source (e.g., VSS) to FX line 320-*b*. As a result, the voltage on FX line 320-*b* (e.g., FX<X> 710-*a*) may decrease. Prior to T7, the voltage on FX line 320-*c* may settle at a high voltage (e.g., FX<Y> 710-*b* may settle at VCCP) and the voltage on FX line 320-*b* may settle at a low voltage (e.g., FX<X> 710-*a* may settle at VSS). In cases where low float transistor 615-*c* is controlled independently from low float transistor 615-*d* (e.g., low float transistor 615-*c* is controlled by FXFLT<X> 715-*a* and low float transistor 615-*d* is controlled by FXFLT<Y> 715-*b*), FX line 320-*b* may transition out of the floating state before, concurrently with, or after FX line 320-*c*. It should further be noted that, in cases where high float transistor 620-*c* is controlled independently from high float transistor 620-*d* (e.g., high float transistor 620-*c* is controlled by FXFLTF<X> 720-*a* and high float transistor 620-*d* is controlled by FXFLTF<Y> 720-*b*), FX line 320-*b* may transition out of the floating state before, concurrently with, or after FX line 320-*c*.

Figure 8:
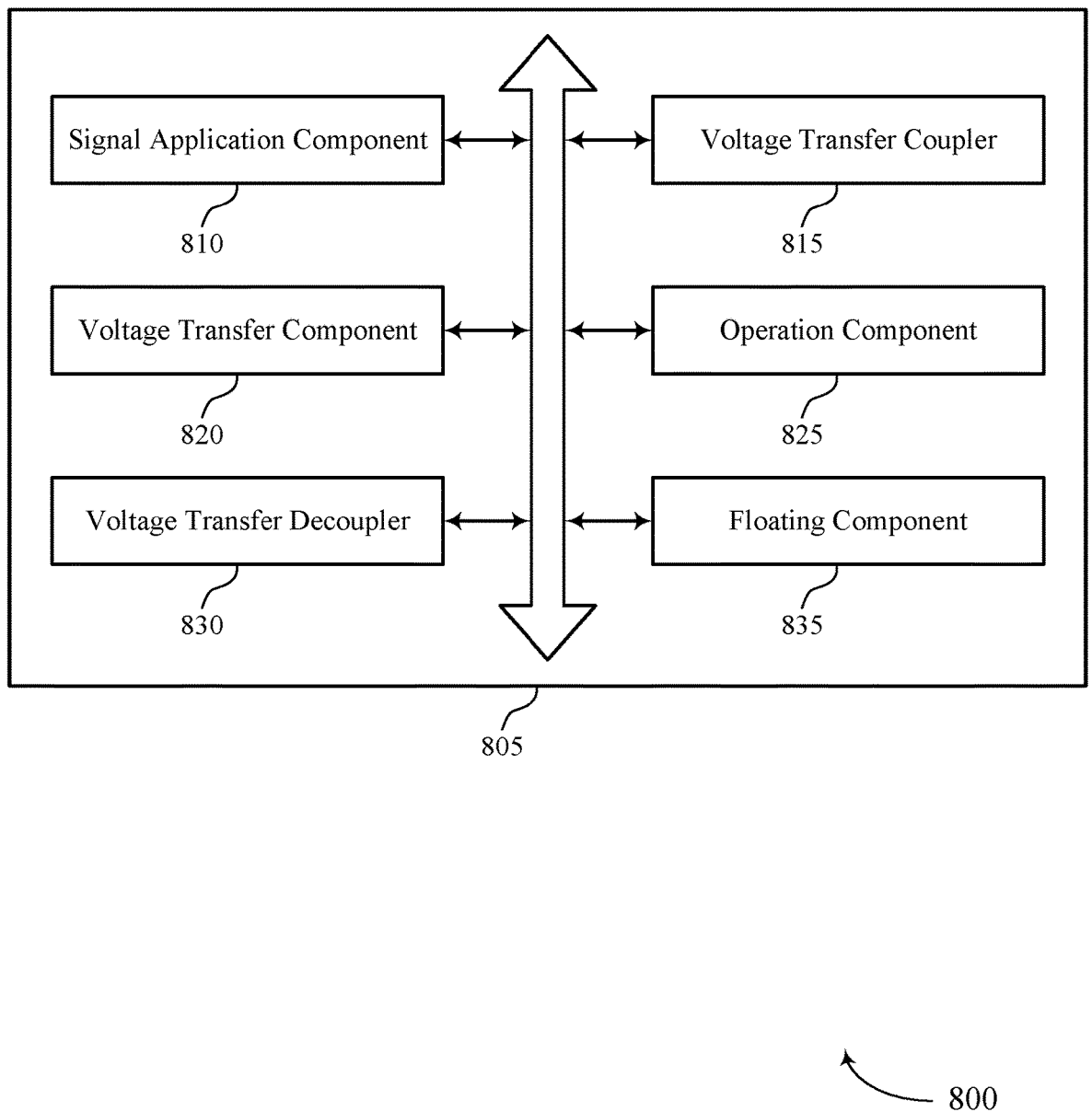
FIG. 8 illustrates a block diagram that supports phase charge sharing as disclosed herein.

FIG. 8 shows a block diagram 800 of logic 805 that supports phase charge sharing as disclosed herein. The logic 805 may be an example of aspects of logic included within a row decoder 220, a column decoder 225, a decoder circuit 300, driver configurations 400, 600-*a* or 600-*b*, or a combination thereof as described with reference to FIGS. 1 through 7. In some cases, a controller may execute instructions that perform at least some of the functions described below, cause at least some of the functions described below to be performed, or may control at least a portion of the logic 805 as part of the performing the functions described below. The logic 805 may include a signal application component 810, a voltage transfer coupler 815, a voltage transfer component 820, an operation component 825, a voltage transfer decoupler 830, and a floating component 835. Each of these components may communicate, directly or indirectly, with one another (e.g., via one or more buses). The operations may additionally or alternatively apply to columns decoders within banks of a DRAM array and their corresponding columns without deviating from the scope of the present disclosure.

The signal application component 810 may apply a first signal to a first conductive line of a row decoder within a bank of a DRAM array and apply a second signal to a second conductive line of the row decoder within the bank of the DRAM array. In some examples, the signal application component 810 may apply a first signal to a first conductive line of a row decoder within a bank of a DRAM array. In some examples, the signal application component 810 may apply the first signal to the second conductive line of the row decoder based on transferring the voltage between the first conductive line and the second conductive line. In some examples, the signal application component 810 may apply a third signal to an access line coupled with at least one row within the bank of the DRAM array based on transferring the voltage between the first conductive line and the second conductive line. In some examples, the signal application component 810 may apply the second signal to the first conductive line of the row decoder and may apply the first signal to the second conductive line of the row decoder after coupling the first conductive line with the second conductive line, wherein opening or closing the one or more rows is based at least in part on applying the second signal to the first conductive line and applying the first signal to the second conductive line. In some examples, the signal application component 810 may apply a second signal to a third conductive line of the decoder as part of the first operation associated with the first memory cell, the second signal being a complement of the first signal. In some examples, the signal application component 810 may apply the second signal to the fourth conductive line as part of the second operation based on transferring the second voltage between the third conductive line and the fourth conductive line.

The voltage transfer coupler 815 may couple the first conductive line of the row decoder with the second conductive line of the row decoder based on applying the first signal to the first conductive line and applying the second signal to the second conductive line. In some examples, the voltage transfer coupler may couple the first conductive line with a second conductive line of the row decoder based on applying the first signal to the first conductive line of the row decoder. In some examples, the voltage transfer coupler 815 may couple the third conductive line with a fourth conductive line of the decoder based on applying the second signal. In some cases, the voltage transfer coupler 815 may determine a first index associated with the first conductive line of the row decoder and determine a second index associated with the second conductive line of the row decoder. Additionally, voltage transfer coupler 815 may couple the first conductive line of the row decoder with the second conductive line of the row decoder based at least in part on the first index and the second index.

The voltage transfer component 820 may transfer voltage between the first conductive line of the row decoder and the second conductive line of the row decoder based on coupling the first conductive line with the second conductive line. In some examples, the voltage transfer component 820 may transfer voltage between the first conductive line of the row decoder and the second conductive line of the row decoder based on coupling the first conductive line with the second conductive line. In some examples, the voltage transfer component 820 may transfer a second voltage between the third conductive line and the fourth conductive line based on coupling the third conductive line with the fourth conductive line. In some examples, the voltage transfer component 820 may transfer the voltage between the first conductive line and the second conductive line occurs between the first operation and the second operation. In some examples, transferring the voltage between the first conductive line of the row decoder and the second conductive line of the row decoder may occur as at least part of an activate operation or a precharge operation, and the second signal may be a complement of the first signal.

The operation component 825 may perform an operation associated with a memory cell of an array of memory cells based on transferring the voltage. In some examples, the operation component 825 may perform a second operation associated with a second memory cell of the array of memory cells based on applying the first signal to the second conductive line. In some cases, the operation includes an activate operation or a precharge operation. In some cases, the second signal is a complement of the first signal. In some cases, the first operation associated with the first memory cell and the second operation associated with the second memory cell include refresh operations. In some cases, the operation component 825 may perform a third operation including a refresh operation, where the third operation is performed after the first operation and before the second operation. Additionally or alternatively, the operation component 825 may open or close one or more rows within the bank of the DRAM array based at least in part on transferring the voltage between the first conductive line of the row decoder and the second conductive line of the row decoder within the bank of the DRAM array. In some cases, the operation component 825 may open or close a first set of rows within the bank of the DRAM array based on applying the first signal to the first conductive line of the row decoder. In some examples, the operation component 825 may open or close a second set of rows within the bank of the DRAM array based on applying the first signal to the second conductive line of the row decoder.

The voltage transfer decoupler 830 may decouple the first conductive line of the row decoder from the second conductive line of the row decoder after transferring the voltage between the first conductive line and the second conductive line for a period of time, where applying the second signal to the first conductive line and applying the first signal to the second conductive line is based at least in part on the decoupling. In some examples, the voltage transfer decoupler 830 may decouple the first conductive line from the second conductive line before applying the first signal to the second conductive line.

The floating component 835 may decouple the first conductive line of the row decoder from a source of the first signal. In some examples, the floating component 835 may decouple the second conductive line of the row decoder from a source of the second signal, where coupling the first conductive line with the second conductive line is based at least in part on decoupling the first conductive line from the source of the first signal and decoupling the second conductive line from the source of the second signal. In some examples, the floating component 835 may decouple the first conductive line from a source of the first signal, where coupling the first conductive line with the second conductive line is based on decoupling the first conductive line from the source of the first signal. In some examples, the floating component 835 may decouple the third conductive line from a source of the second signal, and decouple the fourth conductive line from a source of the first signal, wherein coupling the third conductive line with the fourth conductive line is based at least in part on decoupling the third conductive line from the source of the second signal and decoupling the fourth conductive line from the source of the second signal.

Figure 9:
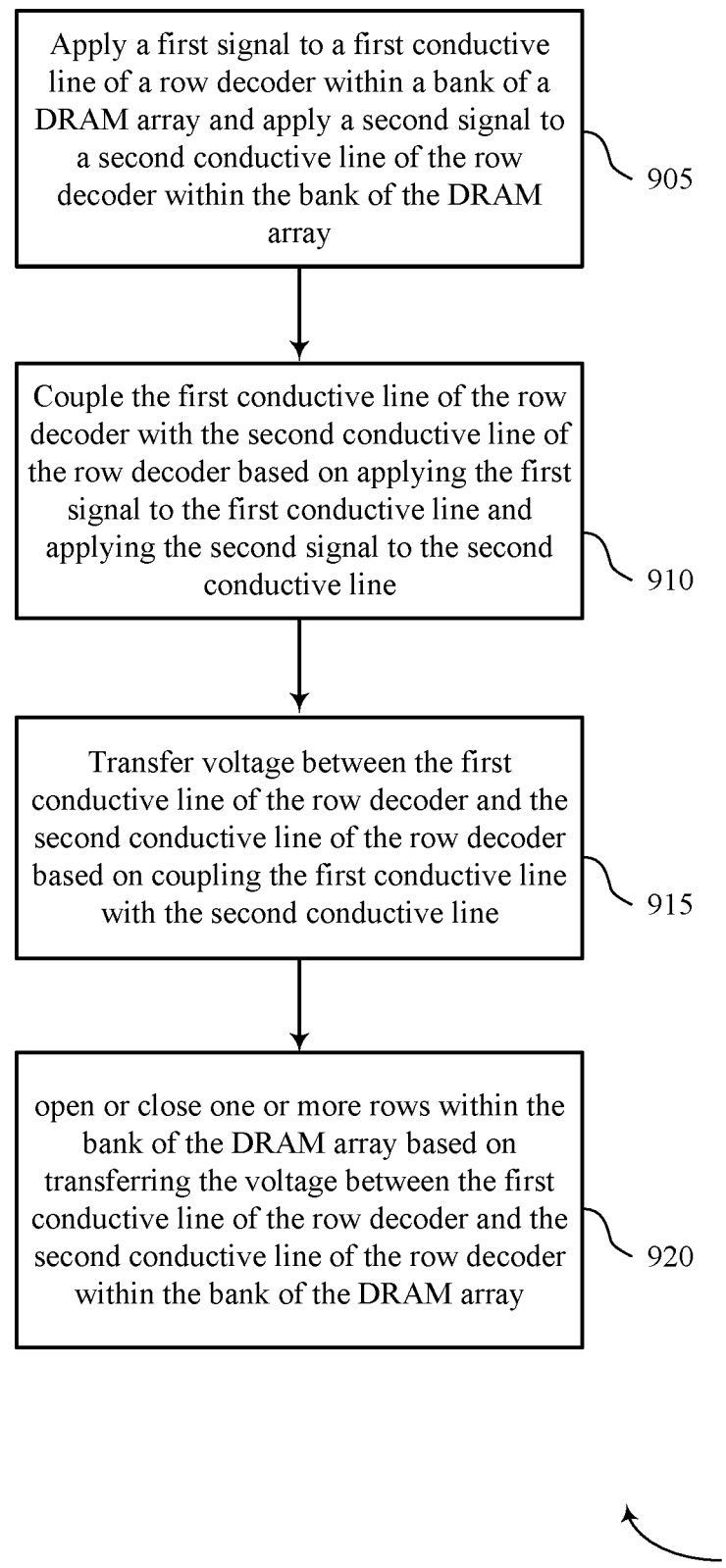
FIGS. 9 through 12 illustrate flowcharts illustrating a method or methods for phase charge sharing as disclosed herein.

FIG. 9 shows a flowchart illustrating a method 900 that supports phase charge sharing as disclosed herein. The operations of method 900 may be implemented by a column decoder, a row decoder, a decoder circuit, a driver configuration, or their components as described herein. For example, the operations of method 900 may be performed using logic 805 as described with reference to FIG. 8. In some examples, a controller may execute a set of instructions to control at least a portion of the logic to perform the functions described below. Additionally or alternatively, a controller may perform aspects of the functions described below using special-purpose hardware.

At 905, the logic may apply a first signal to a first conductive line of a row decoder within a bank of a DRAM array and apply a second signal to a second conductive line of the row decoder within the bank of the DRAM array. The operations of 905 may be performed according to the methods described herein. In some examples, aspects of the operations of 905 may be performed by a signal application component as described with reference to FIG. 8.

At 910, the logic may couple the first conductive line of the row decoder with the second conductive line of the row decoder based on applying the first signal to the first conductive line and applying the second signal to the second conductive line. The operations of 910 may be performed according to the methods described herein. In some examples, aspects of the operations of 910 may be performed by a voltage transfer coupler as described with reference to FIG. 8.

At 915, the logic may transfer voltage between the first conductive line of the row decoder and the second conductive line of the row decoder based on coupling the first conductive line with the second conductive line. The operations of 915 may be performed according to the methods described herein. In some examples, aspects of the operations of 915 may be performed by a voltage transfer component as described with reference to FIG. 8.

At 920, the logic may open or close one or more rows within the bank of the DRAM array based on transferring the voltage between the first conductive line of the row decoder and the second conductive line of the row decoder within the bank of the DRAM array. The operations of 920 may be performed according to the methods described herein. In some examples, aspects of the operations of 920 may be performed by an operation component as described with reference to FIG. 8.

In some examples, an apparatus as described herein may perform a method or methods, such as the method 900. The apparatus may include features, means, or instructions for applying a first signal to a first conductive line of a row decoder within a bank of a DRAM array and apply a second signal to a second conductive line of the row decoder within the bank of the DRAM array; coupling the first conductive line of the row decoder with the second conductive line of the row decoder based on applying the first signal to the first conductive line and applying the second signal to the second conductive line; transferring voltage between the first conductive line of the row decoder and the second conductive line of the row decoder based on coupling the first conductive line with the second conductive line; and opening or closing one or more rows within the bank of the DRAM array based on transferring the voltage between the first conductive line of the row decoder and the second conductive line of the row decoder within the bank of the DRAM array.

In some examples of the method 900 and the apparatus described herein, performing the operation further may include operations, features, means, or instructions for applying a third signal to an access line coupled with at least one row within the bank of the DRAM array based on transferring the voltage between the first conductive line and the second conductive line.

Some examples of the method 900 and the apparatus described herein may further include operations, features, means, or instructions for applying the second signal to the first conductive line of the row decoder and applying the first signal to the second conductive line of the row decoder after coupling the first conductive line with the second conductive line, where opening or closing the one or more rows is based on applying the second signal to the first conductive line and applying the first signal to the second conductive line.

Some examples of the method 900 and the apparatus described herein may further include operations, features, means, or instructions for decoupling the first conductive line of the row decoder from the second conductive line of the row decoder after transferring the voltage between the first conductive line and the second conductive line for a period of time, where applying the second signal to the first conductive line and applying the first signal to the second conductive line is based on the decoupling.

Some examples of the method 900 and the apparatus described herein may further include operations, features, means, or instructions for decoupling the first conductive line of the row decoder from a source of the first signal, and decoupling the second conductive line of the row decoder from a source of the second signal, where coupling the first conductive line with the second conductive line is based on decoupling the first conductive line from the source of the first signal and decoupling the second conductive line from the source of the second signal.

In some examples of the method 900 and the apparatus described herein, where transferring the voltage between the first conductive line of the row decoder and the second conductive line of the row decoder occurs as at least part of an activate operation or a precharge operation.

In some examples of the method 900 and the apparatus described herein, the second signal may be a complement of the first signal.

Figure 10:
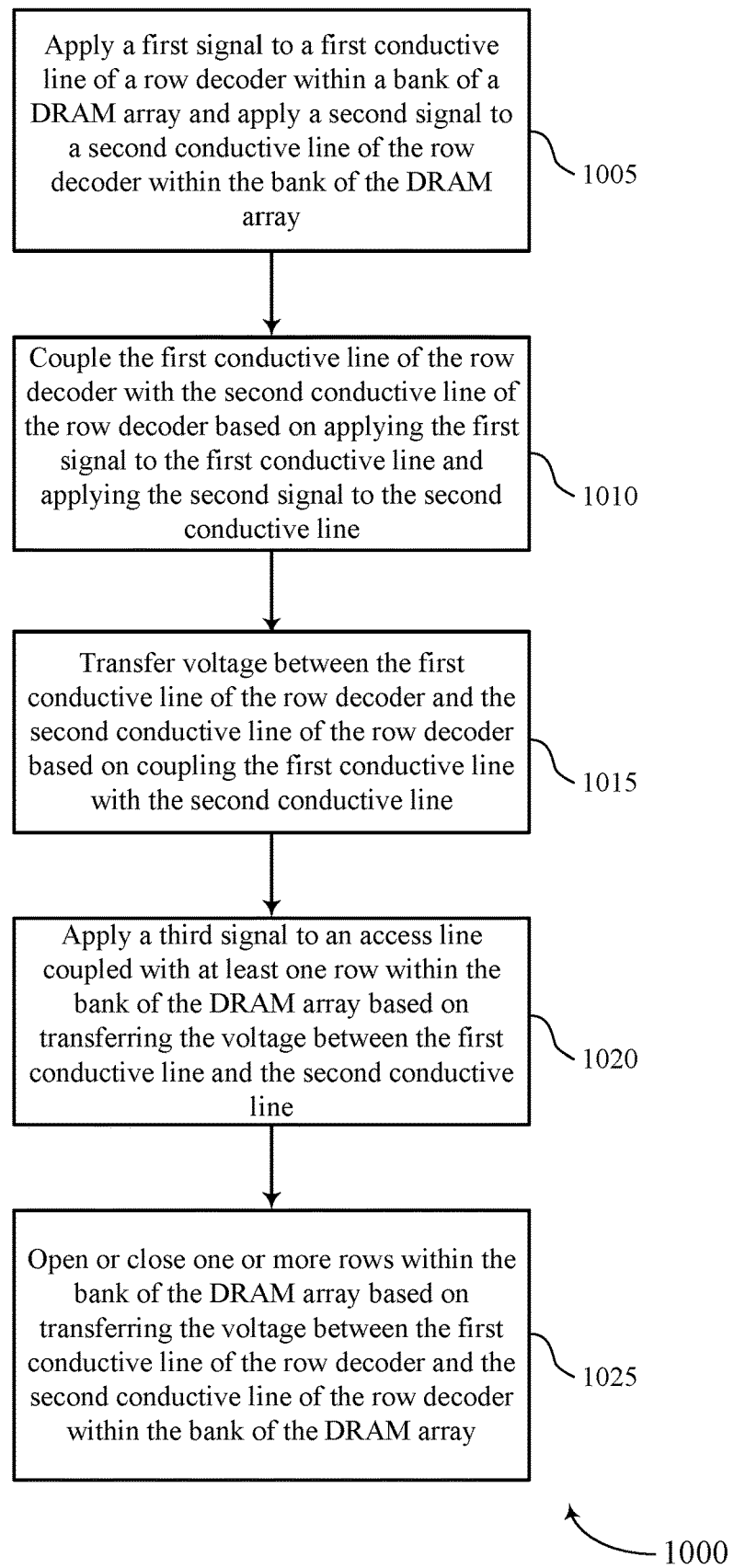

FIG. 10 shows a flowchart illustrating a method 1000 that supports phase charge sharing as disclosed herein. The operations of method 1000 may be implemented by a column decoder, a row decoder, a decoder circuit, a driver configuration or their components as described herein. For example, the operations of method 1000 may be performed by logic 805 as described with reference to FIG. 8. In some examples, a controller may execute a set of instructions to control the at least a portion of the logic to perform the functions described below. Additionally or alternatively, a controller may perform aspects of the functions described below using special-purpose hardware.

At 1005, the logic may apply a first signal to a first conductive line of a row decoder within a bank of a DRAM array and apply a second signal to a second conductive line of the row decoder within the bank of the DRAM array. The operations of 1005 may be performed according to the methods described herein. In some examples, aspects of the operations of 1005 may be performed by a signal application component as described with reference to FIG. 8.

At 1010, the logic may couple the first conductive line of the row decoder with the second conductive line of the row decoder based on applying the first signal to the first conductive line and applying the second signal to the second conductive line. The operations of 1010 may be performed according to the methods described herein. In some examples, aspects of the operations of 1010 may be performed by a voltage transfer coupler as described with reference to FIG. 8.

At 1015, the logic may transfer voltage between the first conductive line of the row decoder and the second conductive line of the row decoder based on coupling the first conductive line with the second conductive line. The operations of 1015 may be performed according to the methods described herein. In some examples, aspects of the operations of 1015 may be performed by a voltage transfer component as described with reference to FIG. 8.

At 1020, the logic may apply a third signal to an access line coupled with at least one row within the bank of the DRAM array based at least in part on transferring the voltage between the first conductive line and the second conductive line. The operations of 1020 may be performed according to the methods described herein. In some examples, aspects of the operations of 1020 may be performed by a signal application component as described with reference to FIG. 8.

At 1025, the logic may open or close one or more rows within the bank of the DRAM array based on transferring the voltage between the first conductive line of the row decoder and the second conductive line of the row decoder within the bank of the DRAM array. The operations of 1025 may be performed according to the methods described herein. In some examples, aspects of the operations of 1025 may be performed by an operation component as described with reference to FIG. 8.

Figure 11:
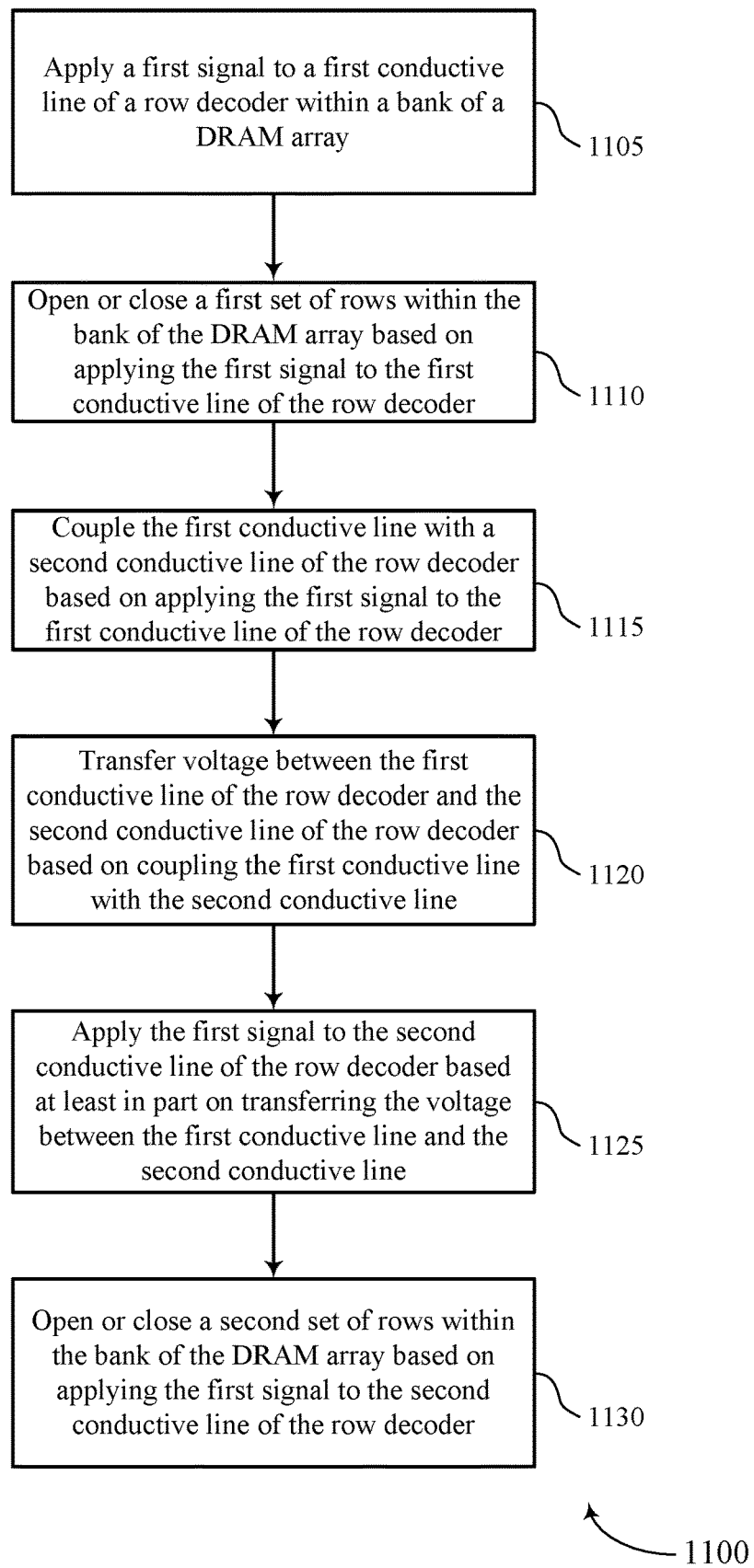

FIG. 11 shows a flowchart illustrating a method 1100 that supports phase charge sharing as disclosed herein. The operations of method 1100 may be implemented by a column decoder, a row decoder, a decoder circuit, a driver configuration or their components as described herein. For example, the operations of method 1100 may be performed by logic 805 as described with reference to FIG. 8. In some examples, a controller may execute a set of instructions to control at least a portion of the logic to perform the functions described below. Additionally or alternatively, a controller may perform aspects of the functions described below using special-purpose hardware.

At 1105, the logic may apply a first signal to a first conductive line of a row decoder within a bank of a DRAM array. The operations of 1105 may be performed according to the methods described herein. In some examples, aspects of the operations of 1105 may be performed by a signal application component as described with reference to FIG. 8.

At 1110, the logic may open or close a first set of rows within the bank of the DRAM array based on applying the first signal to the first conductive line of the row decoder. The operations of 1110 may be performed according to the methods described herein. In some examples, aspects of the operations of 1110 may be performed by an operation component as described with reference to FIG. 8.

At 1115, the logic may couple the first conductive line with a second conductive line of the row decoder based on applying the first signal to the first conductive line of the row decoder. The operations of 1115 may be performed according to the methods described herein. In some examples, aspects of the operations of 1115 may be performed by a voltage transfer component as described with reference to FIG. 8.

At 1120, the logic may transfer voltage between the first conductive line of the row decoder and the second conductive line of the row decoder based on coupling the first conductive line with the second conductive line. The operations of 1120 may be performed according to the methods described herein. In some examples, aspects of the operations of 1120 may be performed by a voltage transfer component as described with reference to FIG. 8.

At 1125, the logic may apply the first signal to the second conductive line of the row decoder based on transferring the voltage between the first conductive line and the second conductive line. The operations of 1125 may be performed according to the methods described herein. In some examples, aspects of the operations of 1125 may be performed by a signal application component as described with reference to FIG. 8.

At 1130, the logic may open or close a second set of rows within the bank of the DRAM array based on applying the first signal to the second conductive line of the row decoder. The operations of 1130 may be performed according to the methods described herein. In some examples, aspects of the operations of 1130 may be performed by an operation component as described with reference to FIG. 8.

In some examples, an apparatus as described herein may perform a method or methods, such as the method 1100. The apparatus may include features, means, or instructions for applying a first signal to a first conductive line of a row decoder within a bank of a DRAM array; opening or closing a first set of rows within the bank of the DRAM array based on applying the first signal to the first conductive line of the row decoder; coupling the first conductive line with a second conductive line of the row decoder based on applying the first signal to the first conductive line of the row decoder; transferring voltage between the first conductive line of the row decoder and the second conductive line of the row decoder based on coupling the first conductive line with the second conductive line; applying the first signal to the second conductive line of the row decoder based on transferring the voltage between the first conductive line and the second conductive line; and opening or closing a second set of rows within the bank of the DRAM array based on applying the first signal to the second conductive line of the row decoder.

Some examples of the method 1100 and the apparatus described herein may further include operations, features, means, or instructions for decoupling the first conductive line of the row decoder from a source of the first signal, and decoupling the second conductive line of the row decoder from a source of a second signal, the second signal being a complement of the first signal, where coupling the first conductive line with the second conductive line is based on decoupling the first conductive line from the source of the first signal and decoupling the second conductive line from the source of the second signal.

Some examples of the method 1100 and the apparatus described herein may further include operations, features, means, or instructions for decoupling the first conductive line from the second conductive line of the row decoder before applying the first signal to the second conductive line of the row decoder.

Some examples of the method 1100 and the apparatus described herein may further include operations, features, means, or instructions for applying a second signal to a third conductive line of the row decoder, the second signal being a complement of the first signal, where opening or closing the first set of rows within the bank of the DRAM array is based on applying the second signal to the third conductive line of the row decoder; coupling the third conductive line with a fourth conductive line of the row decoder based on applying the second signal; transferring a second voltage between the third conductive line of the row decoder and the fourth conductive line of the row decoder based on coupling the third conductive line with the fourth conductive line; and applying the second signal to the fourth conductive line of the row decoder based on transferring the second voltage between the third conductive line and the fourth conductive line, where opening or closing the second set of rows within the bank of the DRAM array is based on applying the second signal to the fourth conductive line of the row decoder.

Some examples of the method 1100 and the apparatus described herein may further include operations, features, means, or instructions for decoupling the third conductive line of the row decoder from a source of the second signal and for decoupling the fourth conductive line of the row decoder from a source of the first signal, where coupling the third conductive line with the fourth conductive line of the row decoder is based at least in part on decoupling the third conductive line of the row decoder from the source of the second signal and decoupling the fourth conductive line of the row decoder from the source of the second signal.

Some examples of the method 1100 and the apparatus described herein may further include operations, features, means, or instructions for transferring the voltage between the first conductive line of the row decoder and the second conductive line of the row decoder occurs between opening or closing the first set of rows and opening or closing the second set of rows.

In some examples of the method 1100 and the apparatus described herein, transferring the voltage between the first conductive line of the row decoder and the second conductive line of the row decoder occurs between refresh operations.

Some examples of the method 1100 and the apparatus described herein may further include operations, features, means, or instructions for determining a first index associated with the first conductive line of the row decoder; determining a second index associated with the second conductive line of the row decoder; and coupling the first conductive line of the row decoder with the second conductive line of the row decoder based at least in part on the first index and the second index.

Figure 12:
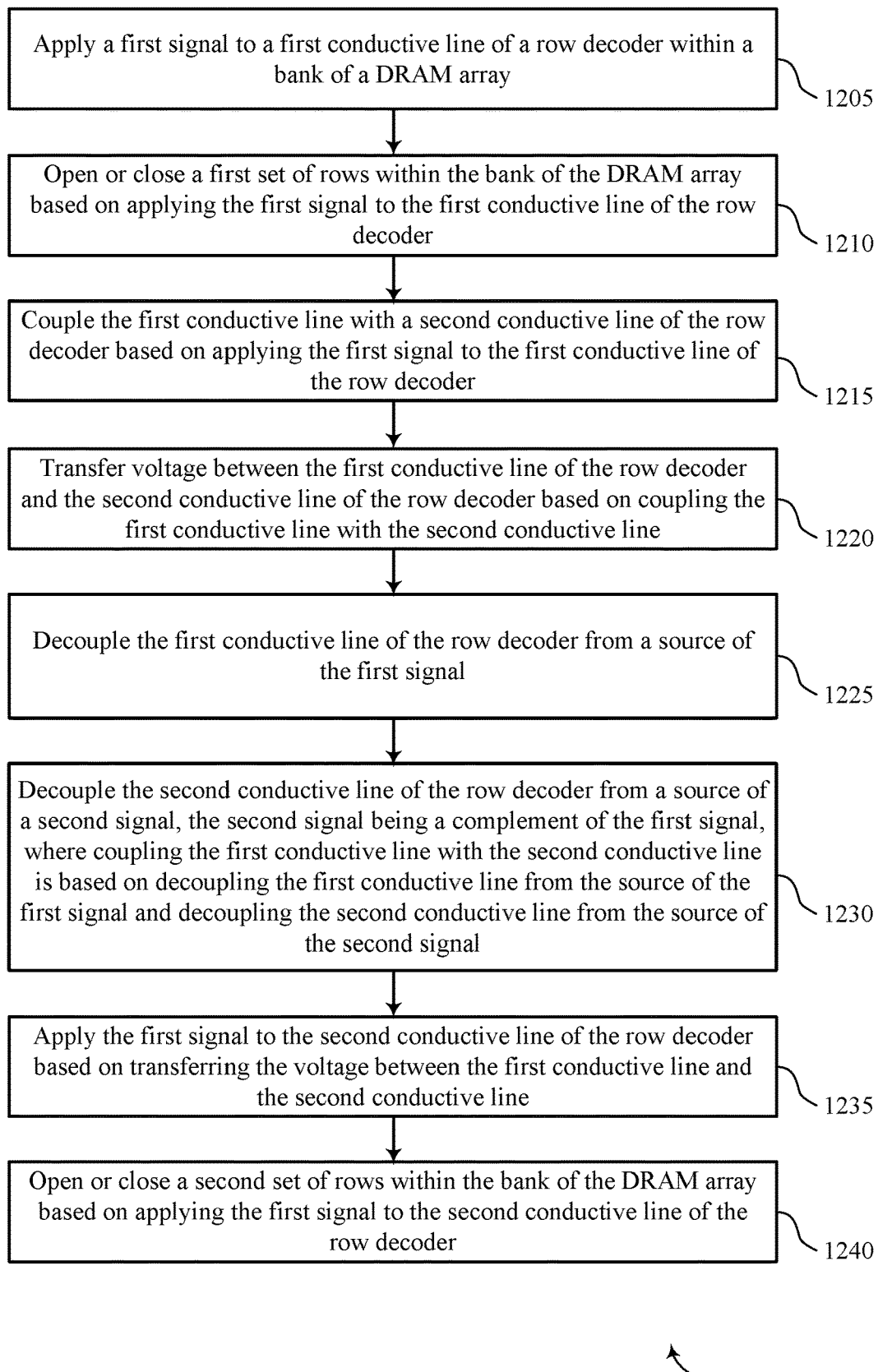

FIG. 12 shows a flowchart illustrating a method 1200 that supports phase charge sharing as disclosed herein. The operations of method 1200 may be implemented by a column decoder, a row decoder, a decoder circuit, a driver configuration or their components as described herein. For example, the operations of method 1200 may be performed by logic 805 as described with reference to FIG. 8. In some examples, a controller may execute a set of instructions to control at least a portion of the logic to perform the functions described below. Additionally or alternatively, a controller may perform aspects of the functions described below using special-purpose hardware.

At 1205, the logic may apply a first signal to a first conductive line of a row decoder within a bank of a DRAM array. The operations of 1205 may be performed according to the methods described herein. In some examples, aspects of the operations of 1205 may be performed by a signal application component as described with reference to FIG. 8.

At 1210, the logic may open or close a first set of rows within the bank of the DRAM array based on applying the first signal to the first conductive line of the row decoder. The operations of 1210 may be performed according to the methods described herein. In some examples, aspects of the operations of 1210 may be performed by an operation component as described with reference to FIG. 8.

At 1215, the logic may couple the first conductive line with a second conductive line of the row decoder based on applying the first signal to the first conductive line of the row decoder. The operations of 1215 may be performed according to the methods described herein. In some examples, aspects of the operations of 1215 may be performed by a voltage transfer component as described with reference to FIG. 8.

At 1220, the logic may voltage between the first conductive line of the row decoder and the second conductive line of the row decoder based on coupling the first conductive line with the second conductive line. The operations of 1220 may be performed according to the methods described herein. In some examples, aspects of the operations of 1220 may be performed by a voltage transfer component as described with reference to FIG. 8.

At 1225, the logic may decouple the first conductive line of the row decoder from a source of the first signal. The operations of 1225 may be performed according to the methods described herein. In some examples, aspects of the operations of 1225 may be performed by a floating component as described with reference to FIG. 8.

At 1230, the logic may decouple the second conductive line of the row decoder from a source of a second signal, the second signal being a complement of the first signal, where coupling the first conductive line with the second conductive line is based on decoupling the first conductive line from the source of the first signal and decoupling the second conductive line from the source of the second signal. The operations of 1230 may be performed according to the methods described herein. In some examples, aspects of the operations of 1230 may be performed by a floating component as described with reference to FIG. 8.

At 1235, the logic may apply the first signal to the second conductive line of the row decoder based on transferring the voltage between the first conductive line and the second conductive line. The operations of 1235 may be performed according to the methods described herein. In some examples, aspects of the operations of 1235 may be performed by a signal application component as described with reference to FIG. 8.

At 1240, the logic may open or close a second set of rows within the bank of the DRAM array based on applying the first signal to the second conductive line of the row decoder. The operations of 1240 may be performed according to the methods described herein. In some examples, aspects of the operations of 1240 may be performed by an operation component as described with reference to FIG. 8.

It should be noted that the methods described above describe possible implementations, and that the operations and the steps may be rearranged or otherwise modified and that other implementations are possible. Further, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
applying a first signal to a first conductive line of a row decoder within a bank of a dynamic random access memory (DRAM) array and applying a second signal to a second conductive line of the row decoder within the bank of the DRAM array;
coupling the first conductive line of the row decoder with the second conductive line of the row decoder based at least in part on applying the first signal to the first conductive line and applying the second signal to the second conductive line;
transferring voltage between the first conductive line of the row decoder and the second conductive line of the row decoder based at least in part on coupling the first conductive line with the second conductive line; and
opening or closing one or more rows within the bank of the DRAM array based at least in part on transferring the voltage between the first conductive line of the row decoder and the second conductive line of the row decoder within the bank of the DRAM array.

2. The method of claim 1, wherein opening or closing the one or more rows within the bank of the DRAM array further comprises:
applying a third signal to an access line coupled with at least one row within the bank of the DRAM array based at least in part on transferring the voltage between the first conductive line and the second conductive line.

3. The method of claim 1, further comprising:
applying the second signal to the first conductive line of the row decoder and applying the first signal to the second conductive line of the row decoder after coupling the first conductive line with the second conductive line, wherein opening or closing the one or more rows is based at least in part on applying the second signal to the first conductive line and applying the first signal to the second conductive line.

4. The method of claim 3, further comprising:
decoupling the first conductive line of the row decoder from the second conductive line of the row decoder after transferring the voltage between the first conductive line and the second conductive line for a period of time, wherein applying the second signal to the first conductive line and applying the first signal to the second conductive line is based at least in part on the decoupling.

5. The method of claim 1, further comprising:
decoupling the first conductive line of the row decoder from a source of the first signal; and
decoupling the second conductive line of the row decoder from a source of the second signal, wherein coupling the first conductive line with the second conductive line is based at least in part on decoupling the first conductive line from the source of the first signal and decoupling the second conductive line from the source of the second signal.

6. The method of claim 1, wherein transferring the voltage between the first conductive line of the row decoder and the second conductive line of the row decoder occurs as at least part of an activate operation or a precharge operation, and the second signal is a complement of the first signal.

7. A method, comprising:
applying a first signal to a first conductive line of a row decoder within a bank of a dynamic random access memory (DRAM) array;
opening or closing a first set of rows within the bank of the DRAM array based at least in part on applying the first signal to the first conductive line of the row decoder;
coupling the first conductive line with a second conductive line of the row decoder based at least in part on applying the first signal to the first conductive line of the row decoder;
transferring voltage between the first conductive line of the row decoder and the second conductive line of the row decoder based at least in part on coupling the first conductive line with the second conductive line;
applying the first signal to the second conductive line of the row decoder based at least in part on transferring the voltage between the first conductive line and the second conductive line; and
opening or closing a second set of rows within the bank of the DRAM array based at least in part on applying the first signal to the second conductive line of the row decoder.

8. The method of claim 7, further comprising:
decoupling the first conductive line from the second conductive line of the row decoder before applying the first signal to the second conductive line of the row decoder.

9. The method of claim 7, wherein transferring the voltage between the first conductive line of the row decoder and the second conductive line of the row decoder occurs between opening or closing the first set of rows and opening or closing the second set of rows.

10. The method of claim 7, wherein transferring the voltage between the first conductive line of the row decoder and the second conductive line of the row decoder occurs between refresh operations.

11. A method, comprising:
applying a first signal to a first conductive line of a row decoder within a bank of a dynamic random access memory (DRAM) array;
opening or closing a first set of rows within the bank of the DRAM array based at least in part on applying the first signal to the first conductive line of the row decoder;
decoupling the first conductive line of the row decoder from a source of the first signal;
decoupling a second conductive line of the row decoder from a source of a second signal, the second signal being a complement of the first signal;
coupling the first conductive line with the second conductive line of the row decoder based at least in part on applying the first signal to the first conductive line of the row decoder, decoupling the first conductive line from the source of the first signal, and decoupling the second conductive line from the source of the second signal;
transferring voltage between the first conductive line of the row decoder and the second conductive line of the row decoder based at least in part on coupling the first conductive line with the second conductive line;
applying the first signal to the second conductive line of the row decoder based at least in part on transferring the voltage between the first conductive line and the second conductive line; and
opening or closing a second set of rows within the bank of the DRAM array based at least in part on applying the first signal to the second conductive line of the row decoder.

12. A method, comprising:
applying a first signal to a first conductive line of a row decoder within a bank of a dynamic random access memory (DRAM) array;
applying a second signal to a third conductive line of the row decoder, the second signal being a complement of the first signal;
opening or closing a first set of rows within the bank of the DRAM array based at least in part on applying the first signal to the first conductive line of the row decoder and applying the second signal to the third conductive line of the row decoder;
coupling the first conductive line with a second conductive line of the row decoder based at least in part on applying the first signal to the first conductive line of the row decoder;
transferring voltage between the first conductive line of the row decoder and the second conductive line of the row decoder based at least in part on coupling the first conductive line with the second conductive line;
applying the first signal to the second conductive line of the row decoder based at least in part on transferring the voltage between the first conductive line and the second conductive line;
coupling the third conductive line with a fourth conductive line of the row decoder based at least in part on applying the second signal;
transferring a second voltage between the third conductive line of the row decoder and the fourth conductive line of the row decoder based at least in part on coupling the third conductive line with the fourth conductive line; and
applying the second signal to the fourth conductive line of the row decoder based at least in part on transferring the second voltage between the third conductive line and the fourth conductive line;
opening or closing a second set of rows within the bank of the DRAM array based at least in part on applying the first signal to the second conductive line of the row decoder and applying the second signal to the fourth conductive line of the row decoder.

13. The method of claim 10, further comprising:
decoupling the third conductive line of the row decoder from a source of the second signal; and
decoupling the fourth conductive line of the row decoder from a source of the first signal, wherein coupling the third conductive line with the fourth conductive line of the row decoder is based at least in part on decoupling the third conductive line of the row decoder from the source of the second signal and decoupling the fourth conductive line of the row decoder from the source of the second signal.

14. A method, comprising:
applying a first signal to a first conductive line of a row decoder within a bank of a dynamic random access memory (DRAM) array;
opening or closing a first set of rows within the bank of the DRAM array based at least in part on applying the first signal to the first conductive line of the row decoder;
determining a first index associated with the first conductive line of the row decoder;
determining a second index associated with a second conductive line of the row decoder, wherein the second index immediately follows the first index;
coupling the first conductive line with the second conductive line of the row decoder based at least in part on applying the first signal to the first conductive line of the row decoder, the first index, and the second index;
transferring voltage between the first conductive line of the row decoder and the second conductive line of the row decoder based at least in part on coupling the first conductive line with the second conductive line;
applying the first signal to the second conductive line of the row decoder based at least in part on transferring the voltage between the first conductive line and the second conductive line; and
opening or closing a second set of rows within the bank of the DRAM array based at least in part on applying the first signal to the second conductive line of the row decoder.

15. An apparatus, comprising:
a dynamic random access memory (DRAM) array comprising an access line coupled with a memory cell;
a row decoder for accessing a bank of the DRAM array, the row decoder configured to apply a first signal to the access line as part of a first operation or as part of a second operation associated with the DRAM array, the row decoder comprising;
a first conductive line for carrying a second signal as part of the first operation or a third signal as part of the second operation;
a second conductive line for carrying the third signal as part of the first operation or the second signal as part of the second operation; and a device for coupling the first conductive line with the second conductive line to transfer voltage between the first conductive line and the second conductive line as part of the second operation.

16. The apparatus of claim 15, wherein the row decoder is configured to apply the first signal to the access line based at least in part on the device coupling the first conductive line with the second conductive line.

17. The apparatus of claim 15, wherein the first conductive line is configured to carry the third signal and the second conductive line is configured to carry the second signal after the first conductive line carries the second signal and the second conductive line carries the third signal.

18. The apparatus of claim 17, wherein the device is configured to decouple the first conductive line from the second conductive line before the first conductive line carries the third signal and the second conductive line carries the second signal.

19. The apparatus of claim 15, wherein the row decoder further comprises:
a second device configured to selectively couple a source of the second signal with the first conductive line; and
a third device configured to selectively couple a source of the third signal with the second conductive line, wherein the device is configured to couple the first conductive line with the second conductive line based at least in part on the second device decoupling the source of the second signal from the first conductive line and the third device decoupling the source of the third signal from the second conductive line.

20. An apparatus, comprising:
a dynamic random access memory (DRAM) array comprising an access line coupled with a memory cell;
a row decoder for accessing a bank of the DRAM array, the row decoder configured to apply a first signal to the access line as part of a first operation or as part of a second operation associated with the DRAM array, the row decoder comprising, wherein one of the first operation or the second operation comprises an activate operation and another of the first operation or the second operation comprises a precharge operation;
a first conductive line for carrying a second signal as part of the first operation or a third signal as part of the second operation;
a second conductive line for carrying the third signal as part of the first operation or the second signal as part of the second operation; and
a device for coupling the first conductive line with the second conductive line to transfer voltage between the first conductive line and the second conductive line as part of the second operation.

21. An apparatus, comprising:
a dynamic random access memory (DRAM) array comprising a first access line coupled with a first memory cell and a second access line coupled with a second memory cell;
a row decoder for accessing a bank of the DRAM array, the row decoder configured to apply signals to the first access line and the second access line as part of a first operation and a second operation, the row decoder comprising:
a first conductive line for carrying a first signal as part of the first operation associated with the first memory cell;
a second conductive line for carrying the first signal as part of the second operation associated with the second memory cell; and
a device for coupling the first conductive line with the second conductive line before performing the second operation associated with the second memory cell.

22. The apparatus of claim 21, wherein the row decoder further comprises:
a second device configured to selectively couple the first conductive line from a source of the first signal; and
a third device configured to selectively couple the second conductive line from a source of a second signal, the second signal being a complement of the first signal, wherein the device is configured to couple the first conductive line with the second conductive line based at least in part on the second device decoupling the first conductive line from the source of the first signal and decoupling the second conductive line from the source of the second signal.

23. An apparatus, comprising:
a dynamic random access memory (DRAM) array comprising a first access line coupled with a first memory cell and a second access line coupled with a second memory cell;
a row decoder for accessing a bank of the DRAM array, the row decoder configured to apply signals to the first access line and the second access line as part of a first operation and a second operation, the row decoder comprising;
a first conductive line for carrying a first signal as part of the first operation associated with the first memory cell;
a second conductive line for carrying the first signal as part of the second operation associated with the second memory cell; and
a device for coupling the first conductive line with the second conductive line before performing the second operation associated with the second memory cell, wherein the device is configured to couple the first conductive line and the second conductive line based on a first index associated with the first conductive line and a second index associated with the second conductive line, wherein the second index immediately follows the first index.

24. An apparatus, comprising:
a dynamic random access memory (DRAM) array comprising a first access line coupled with a first memory cell and a second access line coupled with a second memory cell;
a row decoder for accessing a bank of the DRAM array, the row decoder configured to apply signals to the first access line and the second access line as part of a first operation and a second operation, the row decoder comprising:
a first conductive line for carrying a first signal as part of the first operation associated with the first memory cell;
a second conductive line for carrying the first signal as part of the second operation associated with the second memory cell;
a device for coupling the first conductive line with the second conductive line before performing the second operation associated with the second memory cell;
a third conductive line configured to carry a second signal as part of the first operation associated with the first memory cell, the second signal a complement of the first signal;
a fourth conductive line configured to carry the second signal as part of the second operation associated with the second memory cell; and a second device configured to couple the third conductive line with the fourth conductive line before performing the second operation associated with the second memory cell.

25. The apparatus of claim 24, wherein the row decoder further comprises:
a third device configured to decouple the third conductive line from a source of the second signal; and
a fourth device configured to decouple the fourth conductive line from a source of the first signal, wherein the second device is configured to couple the third conductive line with the fourth conductive line based at least in part on the third device decoupling the third conductive line from the source of the second signal and decoupling the fourth conductive line from the source of the first signal.

* * * * *